United States Patent [19]

Yatsuda et al.

[11] Patent Number: 4,851,364
[45] Date of Patent: * Jul. 25, 1989

[54] METHOD OF FORMING WELL REGIONS FOR FIELD EFFECT TRANSISTORS UTILIZING SELF-ALIGNED TECHNIQUES

[75] Inventors: Yuji Yatsuda, Hachiohji, Japan; Takaaki Hagiwara, Stanford, Calif.; Ryuji Kondo, Kodaira, Japan; Shinichi Minami, Kokubunji, Japan; Yokichi Itoh, Hachiohji, Japan

[73] Assignee: Hitachi, Ltd., Tokyo, Japan

[*] Notice: The portion of the term of this patent subsequent to May 6, 2003 has been disclaimed.

[21] Appl. No.: 850,037

[22] Filed: Apr. 10, 1986

Related U.S. Application Data

[60] Continuation of Ser. No. 487,085, Apr. 21, 1983, Pat. No. 4,586,238, which is a division of Ser. No. 148,481, May 9, 1980, abandoned.

[30] Foreign Application Priority Data

May 25, 1979 [JP] Japan .................................. 54-63941

[51] Int. Cl.$^4$ ...................... H01L 21/26; H01L 21/31
[52] U.S. Cl. ............ 437/42; 148/DIG. 70 DIG. 117; 148/DIG. 141; 156/653; 156/657; 357/23.1; 357/23.5; 357/23.9; 357/23.11; 357/41; 357/42; 437/29; 437/34; 437/40; 437/48; 437/50; 437/58

[58] Field of Search ............. 148/DIG. 70, DIG. 117, 148/DIG 141; 437/29, 34, 40, 42, 50, 58, 48; 357/23.1, 23.5, 23.9, 23.11, 41, 42; 156/653, 657

[56] References Cited

U.S. PATENT DOCUMENTS

| | | | |
|---|---|---|---|
| 3,853,633 | 12/1974 | Armstrong | 437/34 X |
| 3,983,572 | 9/1976 | Johnson | 357/42 X |
| 4,027,380 | 6/1977 | Deal et al. | 437/34 |
| 4,110,899 | 9/1978 | Nagasawa et al. | 437/34 X |
| 4,179,311 | 12/1979 | Athanas | 437/41 |
| 4,268,321 | 5/1981 | Meguro | 437/34 |
| 4,285,116 | 8/1981 | Meguro | 437/34 |
| 4,377,818 | 3/1983 | Kuo et al. | 357/23.5 |
| 4,385,432 | 5/1983 | Kuo et al. | 437/53 X |

Primary Examiner—William G. Saba
Attorney, Agent, or Firm—Antonelli, Terry & Wands

[57] ABSTRACT

The present invention deals with a semiconductor memory circuit device, in which a memory array portion of a rectangular shape consisting of semiconductor nonvolatile memory elements is formed on a main surface of the semiconductor substrate, a low voltage driver circuit (decoder) is formed along a side of the memory array portion, and a high voltage driver circuit is formed along an opposite side of the memory array portion. This permits a reduction in word line length and avoids crossing of the word lines to permit increased operation speed and, particularly, increased reading speed.

64 Claims, 22 Drawing Sheets

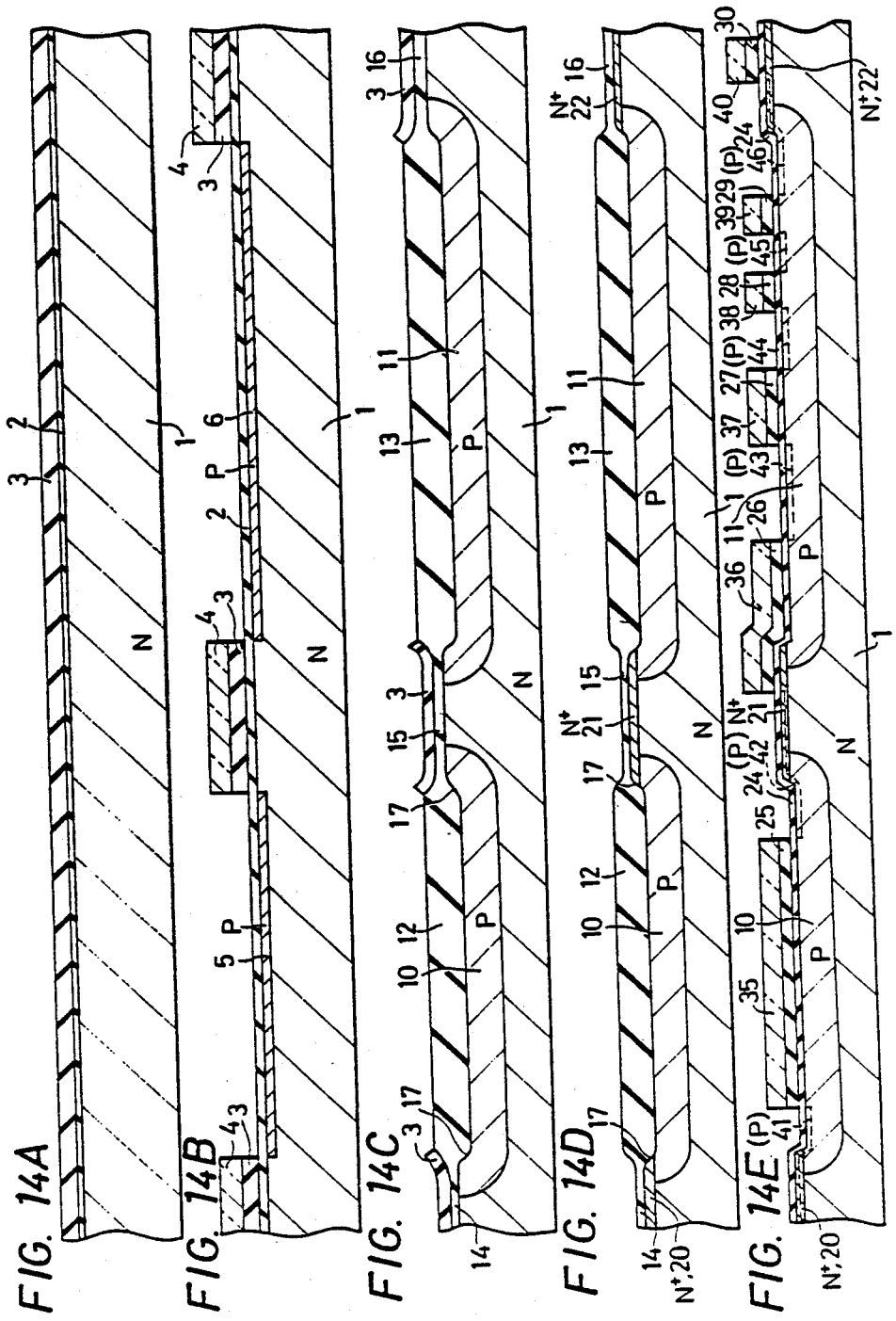

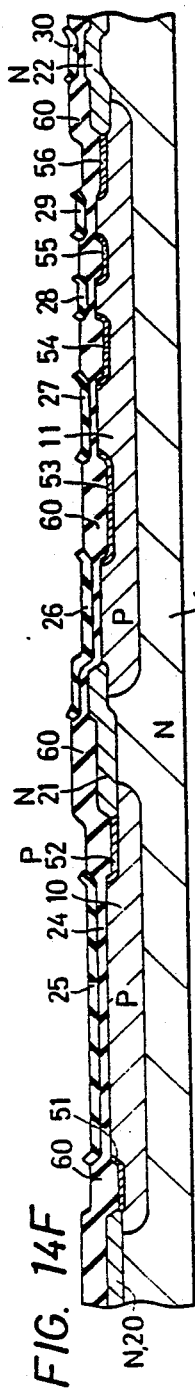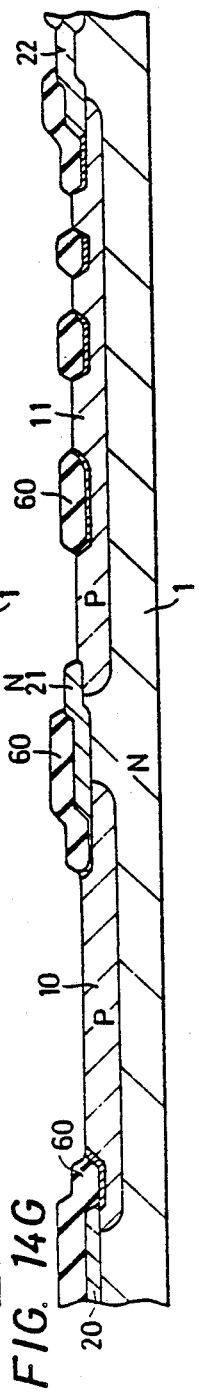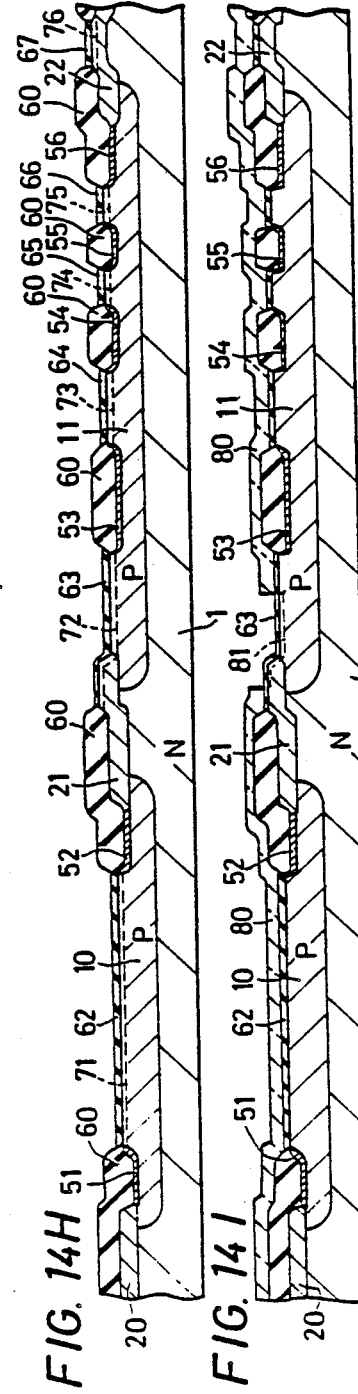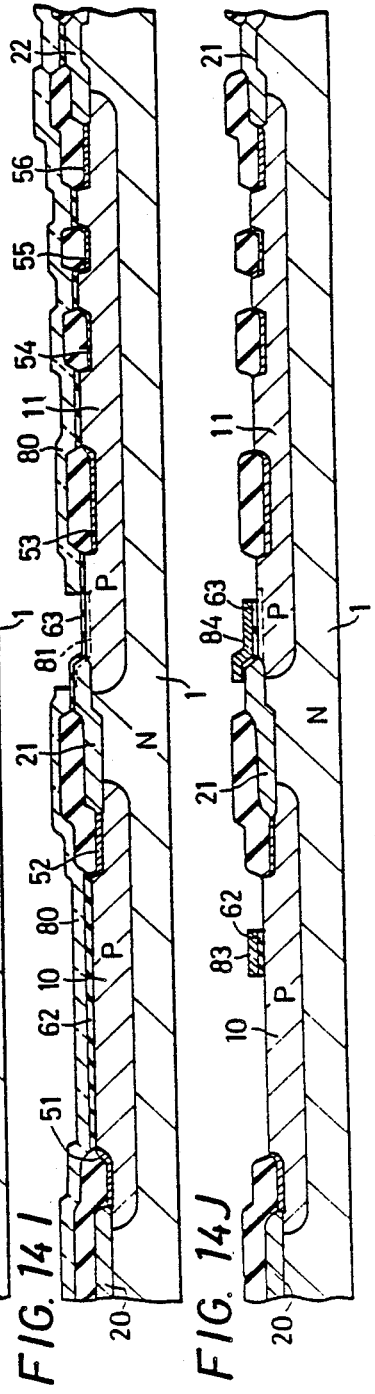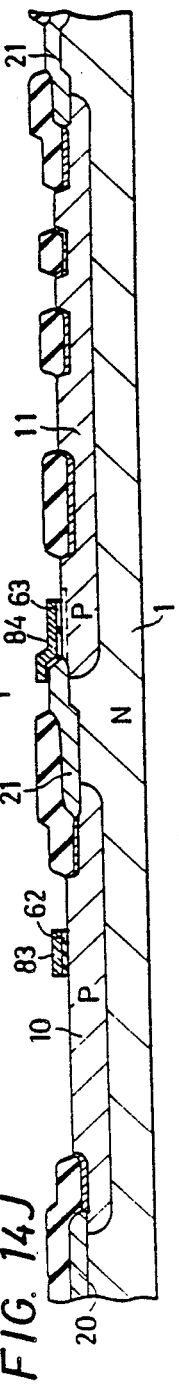

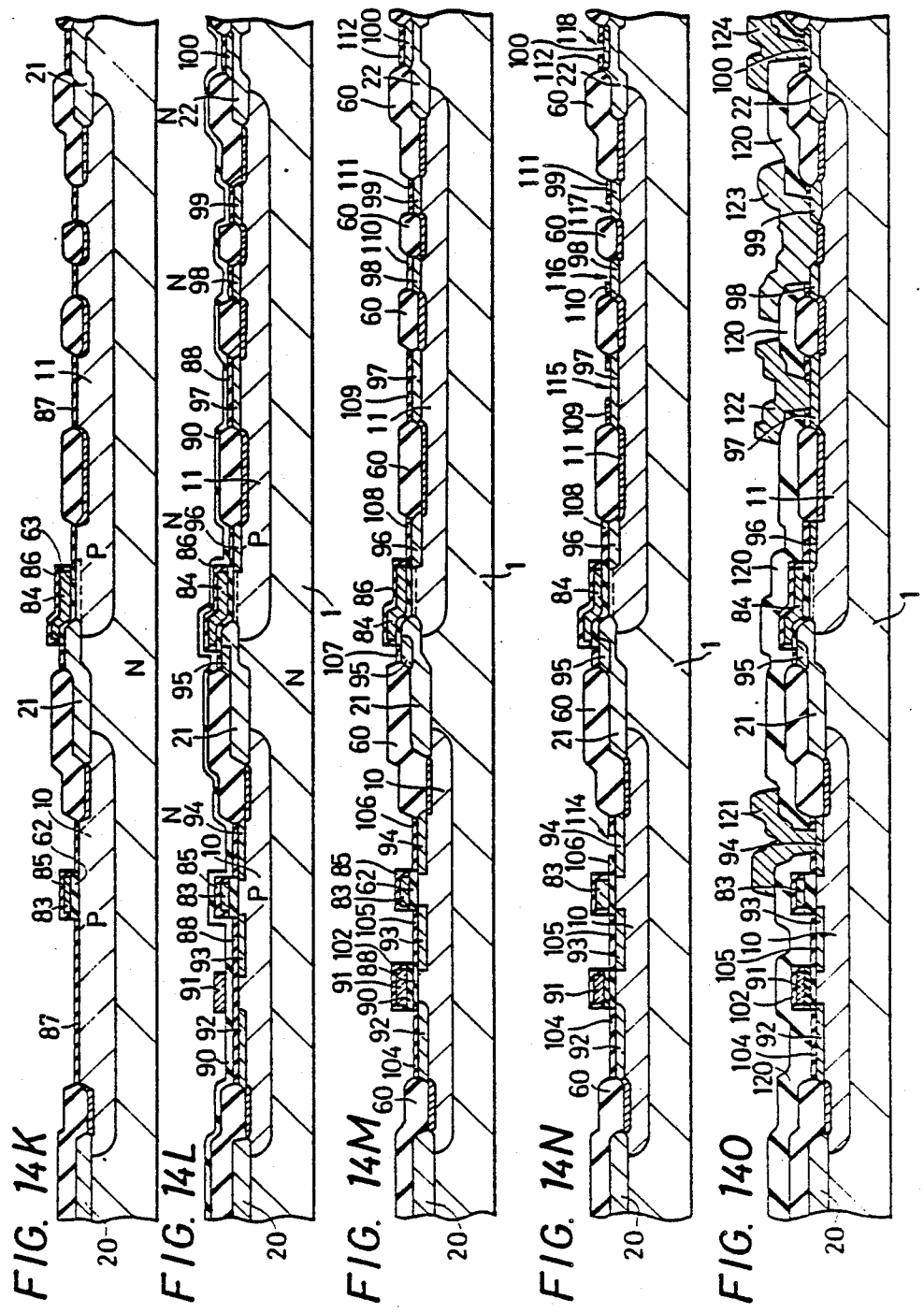

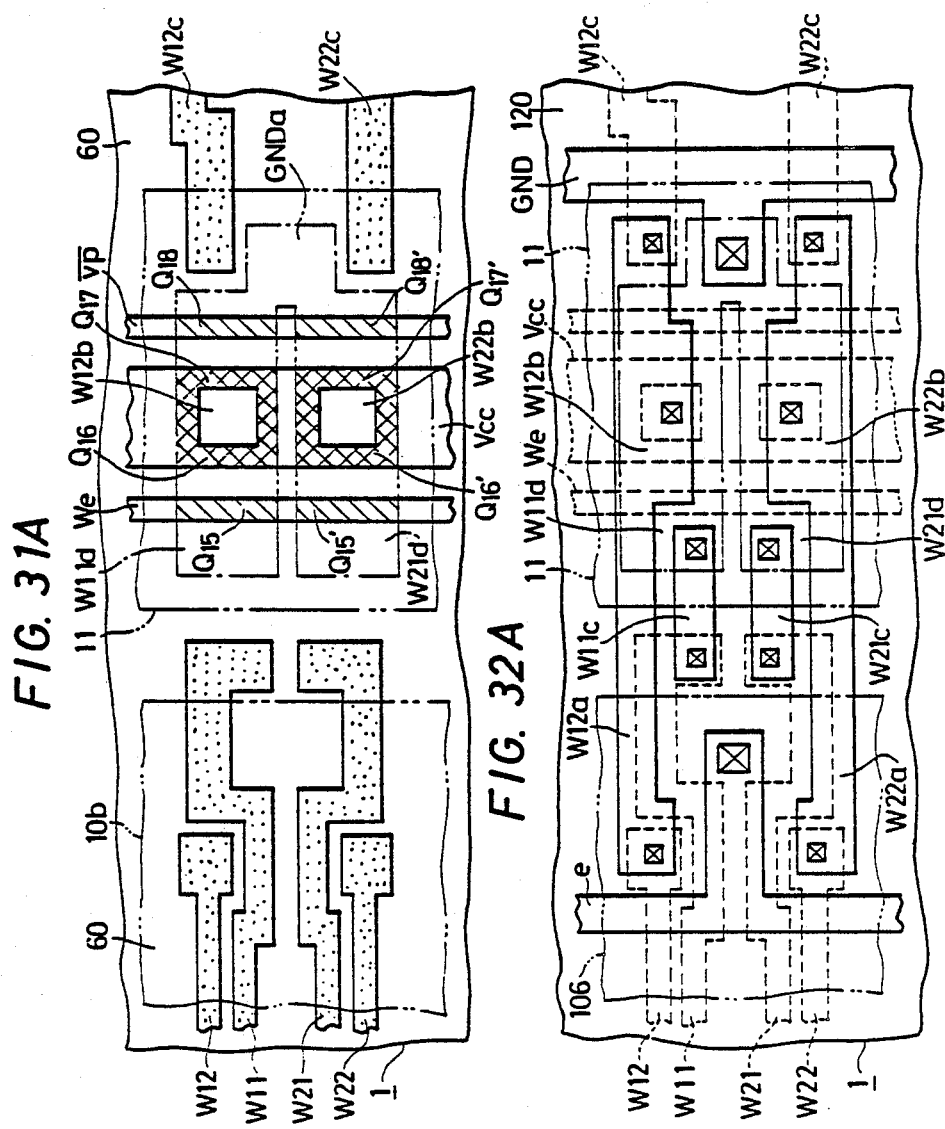

FIG. 33
FIG. 34
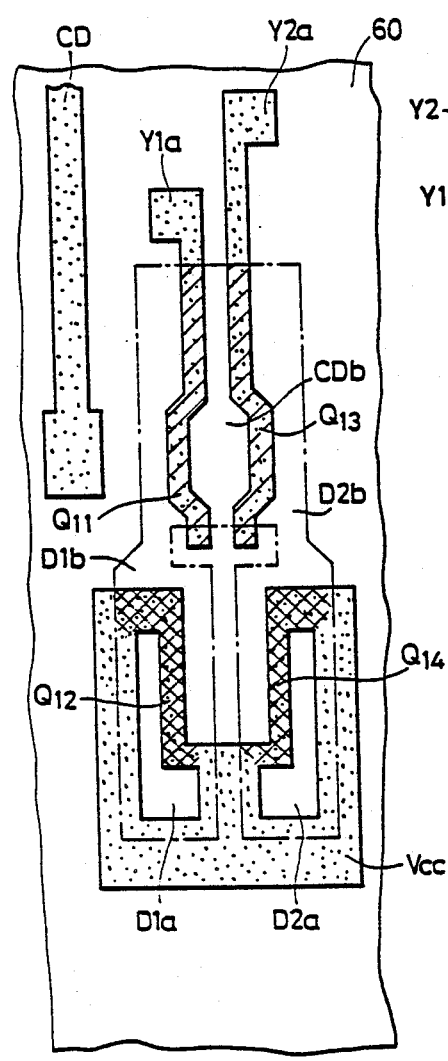
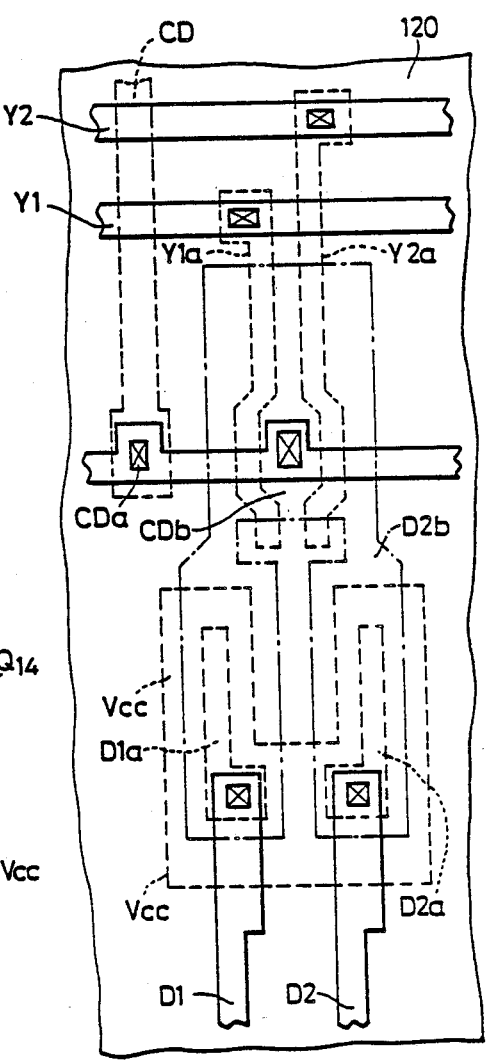

METHOD OF FORMING WELL REGIONS FOR FIELD EFFECT TRANSISTORS UTILIZING SELF-ALIGNED TECHNIQUES

This is a continuation of application Ser. No. 487,085, filed Apr. 21, 1983, now U.S. Pat. No. 4,586,238, which is a divisional application of Ser. No. 148,481, filed May 9, 1980 now abandoned.

BACKGROUND OF THE INVENTION

The present invention relates to a semiconductor device, and more specifically to a semiconductor device such as a semiconductor memory circuit device employing semiconductor non-volatile memory elements which enable information to be written down and erased, as well as to a method of manufacturing the same.

Conventionally known semiconductor non-volatile memory elements can be represented by insulated gate field effect transistors of the type which employs a trap in the gate insulation film or of the type which employs a floating gate. With the insulated gate field effect transistors of this type, a threshold voltage changes from one stable value to another stable value when the electric charge is poured into the trap or the floating gate in the gate insulation film due to hot carriers which are produced by the tunnel effect or the avalanche breakdown. The state of the one threshold voltage is corresponded to, for example, "0" in the binary signal and the state of the another threshold voltage is corresponded to "1" in the binary signal.

The above-mentioned electric charge can be removed by a suitable method.

Therefore, the insulated gate field effect transistors of the above-mentioned type have the advantage that they can be used as non-volatile memory elements which enable information to be written down and erased.

A plurality of the semiconductor non-volatile memory elements are orderly arrayed, for example, on a semiconductor substrate, and are selected to read or write information.

To write the information, the above-mentioned semiconductor non-volatile memory elements require signals of a voltage which is greater by several times than the voltage of the signals which are used for reading the stored information.

However, since limitation is often imposed on the signal levels depending upon the characteristics of the circuit elements, the semiconductor memory circuit device requires a specially designed circuit to deal with the signals of the high levels.

Further, the construction of the semiconductor memory circuit device tends to be complicated depending upon the circuit device for processing the signals of high levels. Therefore, particular attention must be given with regard to that the semiconductor substrate will not become bulky and performance such as operation speed will not be decreased.

Further, the semiconductor circuit device must be realized based chiefly upon the insulated gate field effect transistors, and it is further required to employ bipolar transistors to constitute the circuit as well as to enhance the function. It is therefore required to realize the semiconductor circuit device in the form of a so-called semiconductor integrated circuit which is formed on a piece of a semiconductor substrate. In producing the semiconductor integrated circuit devices, furthermore, it is required to enhance the manufacturing efficiency. Consequently, it is required to realize the electronic circuits through a manufacturing process which is simplified as far as possible.

SUMMARY OF THE INVENTION

The object of the present invention is to provide a semiconductor memory circuit device which employs semiconductor non-volatile memory elements, and which features high speed of operation.

Another object of the present invention is to provide a semiconductor memory circuit device which can be produced in small size employing semiconductor non-volatile memory elements.

A further object of the present invention is to provide a semiconductor memory circuit device in which the individual circuit devices are arrayed at desirable positions on the semiconductor substrate.

Still further object of the present invention is to provide a novel semiconductor memory circuit device employing semiconductor non-volatile memory elements which enable the information to be electrically written down or erased like the insulated gate field effect transistors which employ the trap of the gate insulation film.

Yet further object of the present invention is to provide a semiconductor memory circuit device of a construction which is suited for the semiconductor non-volatile memory elements which enable the information to be electrically written down or erased.

Still another object of the present invention is to provide a circuit device which is suited for processing high-voltage signals.

A further object of the present invention is to provide a circuit device which will have a high degree of unbreakability.

Another object of the present invention is to provide a novel circuit device which includes bipolar transistors and insulated gate field effect transistors.

Still another object of the present invention is to provide a method of manufacturing semiconductor integrated circuit devices for materializing the above-mentioned variety of electronic circuit devices.

In accordance with one construction of the present invention, a memory array portion of a square shape constructed of a plurality of semiconductor non-volatile memory elements is formed on the main surface of a semiconductor substrate, a low voltage driver circuit partially comprising a plurality of insulated gate field effect transistors is formed along one side of the memory array, and a high voltage driver circuit comprising a plurality of insulated gate field effect transistors is formed along the another side of the memory array which is opposite to the side the low voltage driver is formed along.

BRIEF DESCRIPTION OF THE DRAWINGS

FIGS. 14A to 14O are cross-sectional views of the semiconductor substrate in the steps for manufacturing the semiconductor memory circuit device;

FIGS. 31A and 31B are plan views of a writing circuit before the layer of phosphorus glass is formed;

FIGS. 32A and 32B are plan views of the writing circuit after the wiring layer of aluminum is formed;

FIG. 33 is a plan view of a Y gate before the layer of phosphorus glass is formed;

FIG. 34 is a plan view of the Y gate after the wiring layer of aluminum is formed;

DESCRIPTION OF THE PREFERRED EMBODIMENTS

The aforementioned objects and construction of the present invention will become apparent from the below-mentioned detailed description and the accompanying drawings.

The invention is illustrated below in detail with reference to the embodiments.

In the following embodiments, although not specifically restricted, an insulated gate field effect transistor (or a so-called MNOS FET—metal-nitride-oxide semiconductor field effect transistor) having a gate insulation film of a double layer construction consisting of a very thin silicon oxide film and a relatively thick silicon nitride film formed thereon, is used as a semiconductor non-volatile memory element. The MNOS FET is capable of not only electrically writing information that is to be stored but also electrically erasing information.

Figure 1:
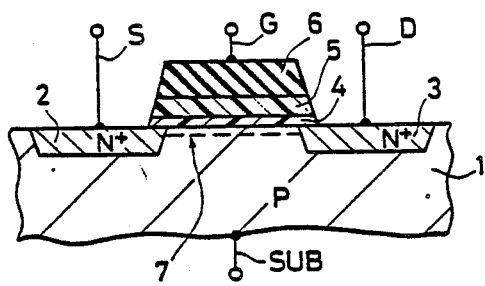
FIG. 1 is a cross-sectional view illustrating a fundamental construction of an insulated gate field effect transistor (hereinafter referred to as MNOS FET) having a gate insulation film which is composed of a nitride film and an oxide film, according to the present invention.

FIG. 1 is a cross-sectional view of the MNOS FET. An n-type source region 2 and an n-type drain region 3 are formed being separated on the surface of a p-type silicon region 1. A gate electrode consisting of an n-type polycrystal silicon is formed on the surface of the p-type silicon region 1 between the source region 2 and the drain region 3, via a gate insulation film which consists of a silicon oxide film 4 of a thickness of, for example, 2 nm (nanometers) and a silicon nitride film 5 of a thickness of 50 nm. The p-type silicon region 1 constitutes a substrate gate region for the MNOS FET.

In the erased state or when no information is being written down, the gate voltage VG vs. drain current ID characteristics of the MNOS FET are as represented by a curve A of FIG. 2, and the threshold voltage assumes a negative value of, for example, 4 volts (hereinafter written as $-4[V]$).

To write or erase the information, the gate insulation film is subjected to a high electric field so that carriers can be poured by the tunnel phenomenon.

When information is being written down, a voltage O [V] which is nearly equal to the ground voltage of the circuit is applied to the substrate gate 1, and a high voltage of, for example, +25 [V] is applied to the gate electrode 6. The source region 2 and the drain region 3 are served with a low voltage of nearly 0 [V] or a high voltage of +20 [V] depending upon information that is to be written down.

A channel 7 is induced in the surface of the silicon region 1 between the source region 2 and the drain 3, responsive to the positive high voltage applied to the gate electrode 6. The potential of the channel 7 is equal to the potential of the source region 2 and the drain region 3.

As the voltage of 0 V is applied to the source region 2 and to the drain region 3 as mentioned above, an electric field of an increased intensity acts upon the gate insulation film responsive to a high voltage of the gate electrode 6. Therefore, carriers consisting of electrons are poured from the channel 7 to the gate insulation film due to the tunnel phenomenon. The VG-ID characteristics of the MNOS FET change from the curve A to a curve B as shown in FIG. 2. Namely, the threshold voltage changes from $-4$ [V] mentioned above to, for example, $+1$ [V].

When the voltage of $+20$ [V] is applied to the source region 2 and the drain region 3 as mentioned above, a potential difference between the gate electrode 6 and the channel 7 decreases to several volts. When the potential difference is so small as mentioned above, it becomes difficult to pour the electrons relying upon the tunnel phenomenon. Therefore, the characteristics of the MNOS FET remain as indicated by the curve A in FIG. 2.

In the semiconductor memory circuit device, a plurality of MNOS FET's are connected to a single digit line. During the above-mentioned writing operation, the voltage mentioned above is applied to the selected MNOS FET's. Gates of the MNOS FET's which are not selected are served with a voltage which is close to 0 [V], or the source region and the drain region are surved with a voltage which is as great as $+20$ [V] as mentioned above.

To erase the stored information, the gate insulation film is subjected to an intense electric field of a direction opposite to that of the electric field that was established when information was written down. The intense electric field of the opposite direction gives rise to the occurrence of the tunnel phenomenon, so that carriers consisting of positive holes are allowed to flow into the gate insulation film. In this case, part of the electrons poured when information is being written down is reversely poured into the substrate, and the remainder of the electrons is neutralized by the positive holes. Accordingly, the characteristics of the MNOS FET return again from the curve B to the curve A of FIG. 2.

In order to erase information according to the embodiment of the present invention, a high voltage of positive polarity such as +25 [V] is applied to the substrate gate 1 while applying 0 [V] to the gate electrode 6, instead of applying a high voltage of negative polarity to the gate electrode 6 while applying 0 [V] to the substrate gate 1, as will become obvious from the subsequent description. With the high voltage of positive polarity being applied to the substrate gate 1, it is allowed to simplify the circuit information for applying a high voltage to the gate electrode 6. Further, a high voltage of the same polarity can be used to write or erase information. Consequently, it is allowed to reduce the number of external terminals of the semiconductor memory circuit device and to reduce the number of power supplies for driving the semiconductor memory circuit device.

Figure 2:
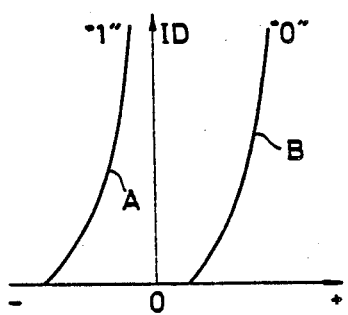
FIG. 2 is a diagram illustrating characteristics curves of the MNOS FET which is shown in FIG. 1.

Since the characteristics of the MNOS FET is represented by either the curve A or the curve B of FIG. 2, information stored in the MNOS FET can be read by detecting the electrically conductive state between the source and the drain when the gate voltage VG is, for example, 0 [V]. To select any one of a plurality of MNOS FET's connected to a single digit line using a signal of one polarity, a unit memory element (hereinafter referred to as memory cell) must be made up of an MNOS FET $Q_1$ and a switching insulated gate field effect transistor (hereinafter referred to as switching MISFET) which is connected in series therewith, as illustrated by an equivalent circuit of FIG. 3. During the reading mode, the gate voltage of the MNOS FET $Q_1$ is maintained at 0 [V], and the gate voltage of the switching MISFET acquires 0 [V] or a positive voltage such as +5 [V], depending upon a selection signal.

Figure 3:
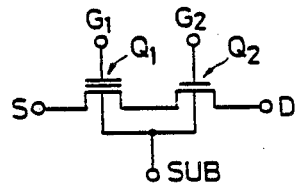
FIG. 3 is a diagram of an equivalent circuit of a memory cell according to the present invention.
Figure 4:
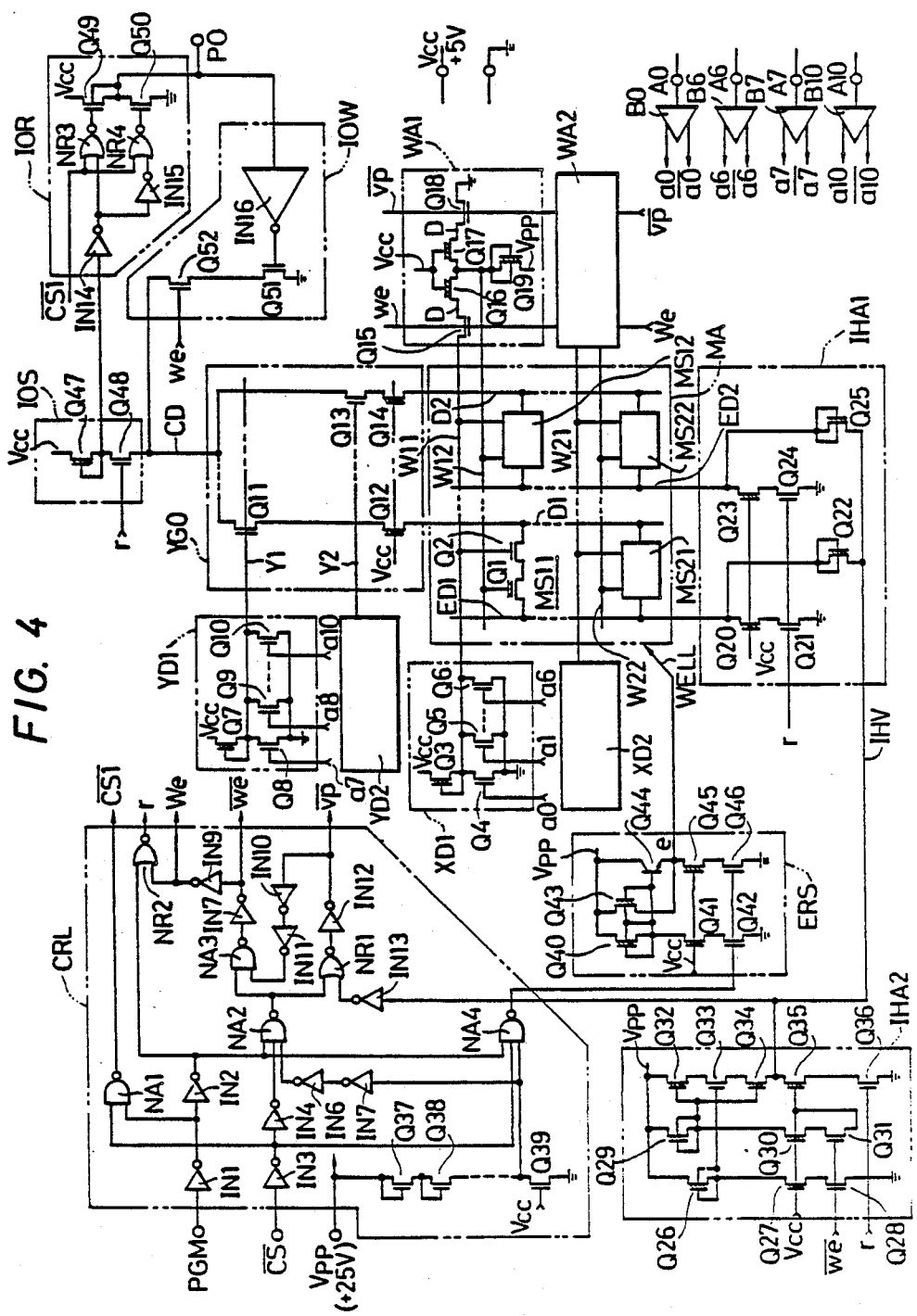
FIG. 4 is a circuit diagram of a semiconductor memory circuit device according to the present invention.

FIG. 4 illustrates the circuit of a semiconductor memory circuit device employing memory cells of FIG. 3.

The memory circuit includes circuits for forming signals of relatively low voltages, such as X decoders, Y decoders, control circuits and the like, as well as circuits for forming signals of relatively high voltages, such as writing circuits, erasing circuits and the like.

Although there is no particular limitation, a low power-supply voltage of +5 [V] is supplied to a power supply terminal VCC for the circuits which form the above-mentioned low-voltage signals. Depending upon the power-supply voltage, the high level of the low-voltage signals is set to be nearly +5 [V], and the low level is set to be 0 [V] which is nearly equal to ground potential of the circuit.

A high-voltage terminal VPP is provided for a circuit device to supply a high voltage to the writing circuit and to the erasing circuit. When the circuit device performs operation for writing information or erasing information, a high voltage of about +25 [V] is supplied to the high-voltage terminal VPP. Depending upon the high voltage, the high level of the high-voltage signals is set to be nearly +25 [V] or +20 [V], and the low level is set to be nearly 0 [V].

In FIG. 4, reference numeral MA represents a memory array which includes memory cells MS11 to MS22 that are arrayed in the form of a matrix. The gates of switching MISFET's $Q_2$ of each of the memory cells MS11, MS12 which are arrayed along the same row, are commonly connected to a first word line W11, and the gates of each of the MNOS FET's $Q_1$ are commonly connected to a second word line W12. Similarly, the gates of switching MISFET's of the memory cells MS21 and MS22 arrayed along another row, are commonly connected to a first word line W21, and the gates of the MNOS FET's are also commonly connected to a second word line W22.

The drains of switching MISFET's $Q_2$ of the memory cells MS11, MS21 which are arrayed along the same column, are commonly connected to a digit line D1, and the sources of MNOS FET's are commonly connected to a reference potential line ED1. Similarly, the drains of switching MISFET's of the memory cells MS12 and MS22 arrayed along another column, and the sources of MNOS FET's are commonly connected to a digit line D2 and a reference potential line ED2, respectively.

According to the embodiment of the present invention, memory stored in the MNOS FET's is erased by applying a positive high voltage to the substrate gate. Therefore, the semiconductor region forming the memory cells is electrically separated from the semiconductor region which forms peripheral circuits such as X decoders and Y decoders, as will be mentioned below. The semiconductor region consists, for example, of a p-type well region formed on the surface of the n-type semiconductor substrate as will be mentioned later.

To erase the information, the individual memory cells may be formed in the individual well regions, or the memory cells which are arrayed along the same row or the same column may be formed in a common well region. According to this embodiment, however, the whole memory cells or a memory array MA is formed in a common well region.

In FIG. 4, a line WELL is connected to the well region which serves as a common substrate gate of the memory array MA.

The first word lines W11 and W21 are connected to the output terminals of the X decoders XD1 and XD2, respectively, and the second word lines W12 and W22 are connected to the output terminals of the writing circuits WA1, WA2, respectively.

The X decoder XD1 consists, as shown in FIG. 4, of a depletion-type load MISFET $Q_3$ which is connected between the power supply VCC and the output terminals, and enhancement-type MISFET's $Q_4$ to $Q_6$ which are connected between the output terminal and the ground terminal and which receive, through the individual gates, non-inverted outputs or inverted outputs fed from the address buffers $B_0$ to $B_6$. The X decoder XD1 substantially constitutes a NOR circuit. When not selected, the X decoder XD1 produces a low-level signal of nearly 0 [V] onto the word line W11 responsive to a signal of the high level fed to at least any one of the address input lines a0 to a6, and when selected, signals of all of the address input lines a0 to a6 become of the low level, so that a high-level signal of about 5 [V] is produced.

The X decoder XD2 is constructed in the same way as the above X decoder XD1 with the exception that different address input lines are connected.

In FIG. 4, further, the depletion-type MISFET such as MISFET $Q_3$ is denoted by a mark which is different from the mark of enhancement-type MISFET's.

A writing circuit WA1 consists of MISFET's Q15 and Q16 which are connected in series between the first word line W11 and the output terminal (second word line W12), a MISFET Q19 which is connected between the output terminal and the power-supply terminal VPP to which will be applied a voltage of +25 [V] during the writing and erasing operations, and MISFET's Q17 and Q18 which are connected in series between the output terminal and the ground terminal. The gate of the MISFET Q15 is connected to a writing control line We, the gate of the MISFET Q18 is connected to a reading/erasing control line $\overline{vp}$, and the gates of the MISFET's Q16 and Q17 are connected to the power-supply terminal VCC.

Owing to a control circuit CRL of a construction which will be mentioned later, the signal of the writing control line We assumes the low level of nearly 0 [V], and the signal of the control line $\overline{vp}$ assumes the high level of nearly +5 [V], except the moment of writing operation. Therefore, the MISFET Q1 remains in a nonconductive state, and the MISFET Q18 remains in a conductive state. The output terminal (second word line W12) is connected to the ground terminal of the circuit via MISFET's Q17 and Q18 which are connected in series, and assumes a potential which is nearly 0 [V].

During the writing operation, a high voltage of +25 [V] is applied to the power supply terminal VPP, a high-level signal of nearly +5 [V] is applied to the writing control line We so that the MISFET Q15 is rendered conductive, and a signal of nearly 0 [V] is applied to the control line $\overline{vp}$ so that the MISFET Q18 is rendered non-conductive.

Due to the conductive state of the MISFET Q15 and the non-conductive state of the MISFET Q18, the signal level of the second word line W1w is determined by the signal level of the first word line W11.

Namely, when the MISFET's Q4 to Q6 for driving the X decoder XD1 are all rendered non-conductive to select the first word line W11, no current path is established for the MISFET'S Q16, Q15 and for the driving MISFET's Q4 to Q6. Therefore, a voltage +25 [V] which is nearly equal to the voltage at the power supply terminal VPP appears on the second word line W12 via the MISFET Q19. In other words, responsive to a voltage of nearly +5 [V] applied to the addressed first word line, a voltage of nearly +25 [V] is impressed upon the addressed word line.

When the first word line W11 is not selected, i.e., when at least any one of the MISFET's Q4 to Q6 for driving the X decoder XD1 is turned on, there is established a current path for grounding the output terminal (second word line W12) via MISFET's Q16, Q15, and driving MISFET's Q4 to Q6. Consequently, the output terminal assumes a potential which is nearly 0 [V].

In the writing circuit WA1, the MISFET's Q16 and Q17 which receive the power supply voltage VCC at all times through the gate, work to prevent the high-voltage signals applied to the second word line W12 from being limited by the breakdown of either the MISFET Q15 or the MISFET Q18.

Namely, if the MISFET Q17 is omitted, the high voltage (+25 [V]) of the second word line W12 will be impressed upon the drain D of the MISFET Q18. Since a low voltage of nearly 0 [V] is applied from the control line vp to the gate of the MISFET Q18, a depletion layer which would spread around the drain junction of the MISFET Q18 is restricted in the vicinity of the gate due to the low voltage of the gate. Therefore, the drain junction of the MISFET Q18 is broken down at a relatively small voltage.

When the MISFET Q17 is provided as shown in FIG. 4, the voltage applied to the drain of the MISFET Q18 is clamped to a voltage which is equal to a value that has increased by a threshold voltage of the MISFET Q17 over the power supply voltage VCC. As a result, the MISFET Q18 is prevented from being broken down. The MISFET Q17 possesses a relatively high drain withstand voltage since its gate is connected to the power supply VCC.

The MISFET Q16 is also employed because of the same reasons as mentioned above with reference to the MISFET Q17.

According to this embodiment, the construction employing the aforementioned well region can be effectively utilized.

The load MISFET Q19 in the writing circuit WA1 is formed in a well region which is independent of the well region forming other MISFET's such as Q15 to Q18. Namely, the substrate gate of the MISFET Q19 is electrically separated from the substrate gates of other MISFET's.

As shown in FIG. 4, the load MISFET Q19 has the substrate gate and the source which are short-circuited, so that a high voltage will not be applied from the substrate gate to the channel between the source and the drain.

Apart from the connection shown in FIG. 4, when the substrate gate is connected to the ground terminal like other MISFET's, a great voltage is required for the output terminal (second word line W12), whereby the threshold voltage of the MISFET Q19 caused by the substrate bias effect becomes considerably greater than that of the MISFET for treating the low voltage. Consequently, greatly increased voltage must be supplied to the high-voltage terminal VPP relative to the voltage which is required for the output terminal (second word line W12).

In the case of the diagramatized connection, on the other hand, the voltage of the substrate gate becomes equal to the voltage of the source, whereby the increase in the threshold voltage of the MISFET Q19 caused by the substrate bias effect can be substantially neglected. As a result, the high voltage supplied to the high-voltage terminal VPP can be relatively decreased.

By employing the construction which permits decreased voltage to be applied to the high-voltage terminal VPP as mentioned above, a variety of pn junctions to which is connected the high-voltage terminal VPP need not have abnormally high withstand voltage, or undesirable leakage current in the pn junctions can be reduced. It is further allowed to prevent the induction of undesirable parasitic channel on the surface of the semiconductor that will be caused by the electric field established by the wiring connected to the high-voltage terminal VPP.

The reference potential lines ED1 and ED2 of the memory array MA have been connected to a writing inhibit circuit IHA1.

Referring to the writing inhibit circuit IHA1, a unit switching circuit is composed of MISFET's Q20 and Q21 which are connected in series between the reference potential line ED1 and the ground terminal. The MISFET Q21 in the unit switch circuit receives a control signal from the control circuit CRL via a control line r. During the operation for reading the stored information, the control signal acquires a level of +5 [V] so that the MISFET Q21 is rendered conductive, and during the operations for writing and erasing the information, the control signal acquires a level of 0 [V] so that the MISFET Q21 is rendered non-conductive.

Therefore, during the operation for reading information, the unit switching circuit causes the reference potential line ED1 to assume a level of nearly 0 [V].

A MISFET Q22 is connected between the reference potential line ED1 and a high-voltage signal line IHV. The high-voltage signal line IHV receives a signal of a high level of nearly +20 [V] during the writing and erasing operations, and a signal of nearly 0 [V] during the reading operation, such signals being generated by a writing inhibit voltage generator IHA2 which will be mentioned later.

Therefore, when the MISFET Q21 of the unit switching circuit is rendered non-conductive during the writing and erasing operations, the reference potential line ED1 is served with a high voltage from the high-voltage signal line IHV via the MISFET Q22.

A unit switching circuit same as the above-mentioned unit switching circuit, consisting of MISFET's Q23 and Q24, is connected between the reference potential line ED2 and the ground terminal, and a MISFET Q25 is connected between the reference potential line ED2 and the high-voltage signal line IHV.

In the writing inhibit circuit IHA1, the MISFET's Q20 and Q23 which receive through the gate the power supply voltage VCC of +5 [V], are employed because of the same reasons as the MISFET's Q16 and Q17 employed for the writing circuit WA1, since the high voltage is applied to the reference potential lines ED1 and ED2.

Like the aforementioned MISFET Q19, the MISFET's Q22 and Q25 are formed in the independent well regions in order to prevent the threshold voltage from being increased by the substrate bias effect, and so that the voltage of the reference potential lines ED1 and ED2 will not be decreased relative to the high voltage of the high-voltage signal line IHV.

A Y gate circuit YGO is connected between the digit lines D1, D2 of the memory array MA and the common digit line CD.

In the Y gate circuit YGO, a unit gate circuit is constituted by MISFET's Q11 and Q12 which are connected in series between the digit line D1 and the common digit line CD, and the digit line D1 and the common digit line CD are coupled together responsive to the output of the Y decoder YD1. Similarly, MISFET's Q13 and Q14 constitute another unit gate circuit which couples the digit line D2 and the common digit line together responsive to the output of the Y decoder YD2.

High-voltage signals appear on the digit lines D1, D2 during the writing and erasing operations. Therefore, the unit switching circuit in the Y-gate circuit YGO employs MISFET's Q12 and Q14 as shown in FIG. 4 to receive the power supply voltage of +5 [V] through the gate thereof.

Y decoders YD1, YD2 are constructed in the same manner as the above-mentioned X decoders XD1 and XD2, and selectively receive non-inverted signals a7 to a10 as well as inverted signals $\overline{a7}$ to $\overline{a10}$ which are produced from address buffers B7 to B10, and produce on the output lines Y1 and Y2 decode signals of the high level of +5 [V] when they are selected and decode signals of the level 0 [V] when they are not selected.

A sense circuit IOS and a data input circuit IOW are connected to the common digit line CD which is connected to the Y gate circuit YGO.

The sense circuit IOS consists, as shown in FIG. 4, of a load MISFET Q47 in which the gate is connected to the source thereof, and a switching MISFET Q48 which receives through the gate thereof a signal from the control line r. During the reading mode, the signal on the line r acquires the high level of +5 [V] so that the switching MISFET Q48 is rendered conductive.

The output of the sense circuit IOS is fed to an output buffer circuit IOR which consists of inverters IN14, IN15, NOR circuits NR3, NR4 and MISFET's Q49 and Q50.

In the output buffer circuit IOR, input terminals on one side of the NOR circuits NR3, NR4 are connected to a control line $\overline{CS1}$. During the reading mode, the signal of the control line $\overline{CS1}$ assumes the low level of 0 [V], and during the writing and erasing modes, the signal of the control line $\overline{CS1}$ assume the high level of +5 [V]. Another input terminal of the NOR circuit NR3 is connected to the output terminal of the inverter IN14, and another input terminal of the NOR circuit NR4 is connected to the output terminal of the inverter IN15 which receives the output of the inverter IN14.

Therefore, during the reading mode, the NOR circuits NR3 and NR4 produce signals of opposite phases with respect to each other. The MISFET's Q49 and Q50 which are connected in series are driven in a push-pull manner by the NOR circuits NR3 and NR4.

When the signal of the control line $\overline{CS1}$ is of the high level, both of the NOR circuits NR3 and NR4 produce low-level signals of 0 [V] so that MISFET's Q49 and Q50 are rendered non-conductive. The output terminal of the output buffer circuit IOR is connected to the input/output terminal PO. When the MISFET's Q49 and Q50 are rendered non-conductive simultaneously, the output impedance of the output buffer circuit becomes extremely great, whereby the input signal applied to the input/output terminal PO is not restricted.

In the output buffer circuit IOR, the MISFET Q49 which is connected between the power supply terminal VCC and the output terminal, if formed in a well region which is independent of the well region of other MISFET's. The well region which serves as the substrate gate is connected to the source thereof. Therefore, the threshold voltage is not substantially increased by the substrate bias effect, and the output buffer circuit IOR produces signals of the high level which is nearly equal to the power supply voltage VCC.

The data input circuit IOW consists, as shown in FIG. 4, of an input buffer circuit IN16, a MISFET Q51 which is controlled by the output of the input buffer circuit IN16, and a MISFET Q52 which is connected between the drain of the MISFET Q51 and the common digit line CD and which receives through the gate thereof a signal supplied from the control line We.

The writing inhibit voltage generator IHA2 consists of MISFET's Q26 and Q36 as shown in FIG. 4. The MISFET's Q26 to Q28 constitute a first high-voltage inverter, which produces a high-voltage signal from the output terminal thereof, i.e., from the drain of the MISFET Q27 upon receipt of a low-voltage control signal from the control line We. Owing to the connection as shown in FIG. 4, the level of the output signal changes from nearly 0 [V] to VPP. The MISFET's Q29 to Q31 constitute a second high-voltage inverter, which produces a high-voltage signal through the drain of the MISFET Q30 upon receipt of the same signal as that of the first high-voltage inverter. The level of the output signal changes from nearly +5 [V] (VCC) to VPP. MISFET's Q32 to Q36 constitute a high-voltage push-pull circuit. In the first and second high-voltage inverters and the push-pull output circuit, the MISFET's Q27, Q30 and Q35 which are connected between the MISFET's Q28, Q31, Q36 that receive control signals and the output terminals, and which receive the power supply voltage of +5 [V] through the gates thereof, are provided to assure high output voltage of the circuit, like the aforementioned MISFET's Q16 and Q17. The load MISFET's in the first and second high-voltage inverters have substrate gates which are connected to the sources as shown in FIG. 4, so that the output voltage will not be decreased by the substrate bias effect, and so that the MISFET's Q33, Q32 and Q34 in the push-pull output circuit can be sufficiently operated.

In the push-pull output circuit, the MISFET Q32 is used to control the voltage applied to the drain of the MISFET Q33 when the output of the first high-voltage inverter is nearly 0 [V]. Namely, when the output of the first high voltage inverter is nearly 0 [V], the reference voltage of the second high-voltage inverter assumes a low voltage of +5 [V]; the second high-voltage inverter produces an output of +5 [V]. Consequently, a voltage +5 [V] is applied to the gate of the MISFET Q32, so that the drain voltage of the MISFET Q33 is restrained. The MISFET Q34 works to restrain the high voltage applied from the output line IHV to the source of the MISFET Q33 when the voltage of the output line IHV is raised to +20 [V] by the high-voltage output of the first and second high-voltage inverters, and when the output of the first and second high-voltage inverter is turned into the low level of nearly 0 [V]. Consequently, undesirable breakdown is prevented in the source and drain junctions of the MISFET Q33 when it undergoes the switching operation.

The erasing circuit ERS consists of a high-voltage inverter made up of MISFET's Q40 to Q42, and a push-pull circuit made up of MISFET's Q43 to Q46 and a bipolar transistor Q44. The above high-voltage inverter is constructed in the same manner as the writing inhibit voltage generator circuit IHA2.

In the push-pull output circuit, the bipolar transistor Q44 and the MISFET Q43 are connected in parallel, and are driven by the output of the high-voltage inverter. The well region for forming the memory array constitutes a heavy capacitive load for the erasing circuit as will become obvious from the construction of the circuit device that will be mentioned later. Therefore, the eraser circuit ERS must have sufficiently low output impedance characteristics so that information can be erased at high speeds. In a semiconductor integrated circuit device, the bipolar transistor may be formed in a relatively small size (area) to exhibit sufficiently small operation resistance characteristics for the MISFET's. Therefore, the erasing circuit ERS which employs the bipolar transistor Q44 as an output transistor and which is formed in the semiconductor integrated circuit device occupying a small area, as shown in FIG. 4, works to drive the well region of the memory array MA at sufficiently high speeds. Construction and method of producing the bipolar transistor which is formed on the same semiconductor substrate together with the MISFET's, will be mentioned later.

When only the bipolar transistor Q44 having a threshold voltage (voltage across the base and the emitter) of, for example, 0.6 [V] is used for the erasing circuit ERS, the voltage signal produced onto an output line e is decreased by an amount equal to the threshold voltage of the transistor Q44 even when the high-voltage inverter consisting of MISFET's Q40 or Q42 has produced a signal of a voltage nearly equal to the power supply voltage VPP.

In the erasing circuit ERS shown in FIG. 4, the depression-type MISFET Q43 is connected in parallel with the bipolar transistor Q44, the substrate gate of the MISFET Q43 being formed integrally with the substrate gate of the load MISFET Q40 of the high-voltage inverter, and the gate of the MISFET Q43 being further connected together with the substrate gate thereof to the source of the load MISFET Q40, i.e., connected to the output terminal of the high-voltage inverter. Since the high potential of the substrate gate rises nearly to the power supply voltage VPP, the threshold voltage of the MISFET Q43 is not substantially increased by the substrate bias effect. Therefore, the high voltage in the output line e is raised by the MISFET Q43 to a value nearly equal to the power supply voltage VPP.

The substrate gate of the MISFET Q43 may be connected to the source thereof, i.e., to the output line e. Even in the this case, it is allowed to prevent the output level of the output line e from being decreased by the substrate bias effect. With this circuit formation, however, the well region which serves as a substrate gate for the MISFET Q40 must be separated from the well region which serves as a substrate gate for the MISFET Q43. Since a predetermined gap must be provided between the well regions, there arises disadvantage that the required areas of the semiconductor substrate must be increased.

The control circuit CRL consists of inverters IN1 to IN12, NAND circuits NA1 to NA4, NOR circuits NR1, NR2, and MISFET's Q37 to Q39 which are connected in series. The control circuit CRL receives writing control signals, chip selection signals, writing signals and erasing signals through the external terminals PGM, $\overline{CS}$ and VPP, and produces control signals onto the lines $\overline{CS1}$, r, We, $\overline{We}$ and $\overline{vp}$ upon receipt of an output signal from the writing inhibit voltage generator IHA2.

The signals supplied to the terminal VPP are high-voltage signals of +25 [V] which are commonly used as power supply voltage for the writing circuits WA1, WA2, writing inhibit voltage generator IHA2 and erasing circuit ERS.

The control circuit CRL includes a level shift circuit consisting of MISFET's Q37 to Q39 so that the writing or erasing operation can be controlled only when the signal of the terminal VPP has exceeded a predetermined level.

Figure 5:
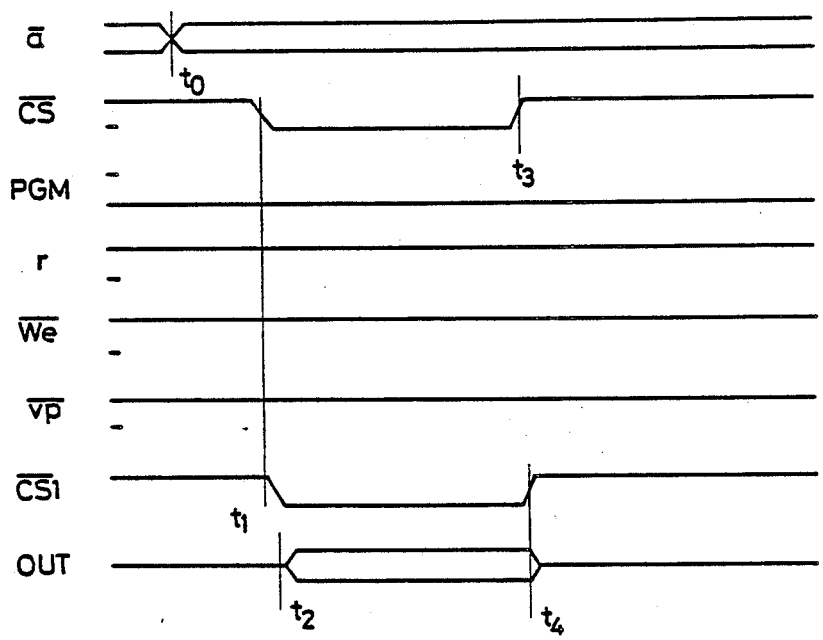
FIGS. 5, 6 and 7 are timing charts for illustrating the operation of the circuit of FIG. 4.
Figure 6:
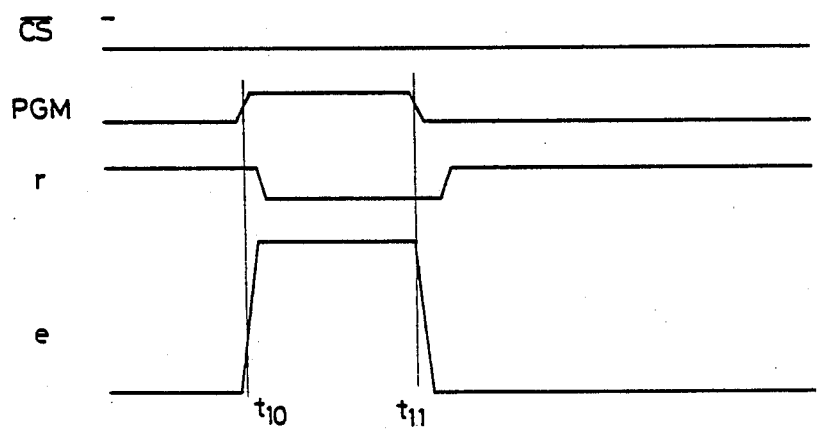
Figure 7:
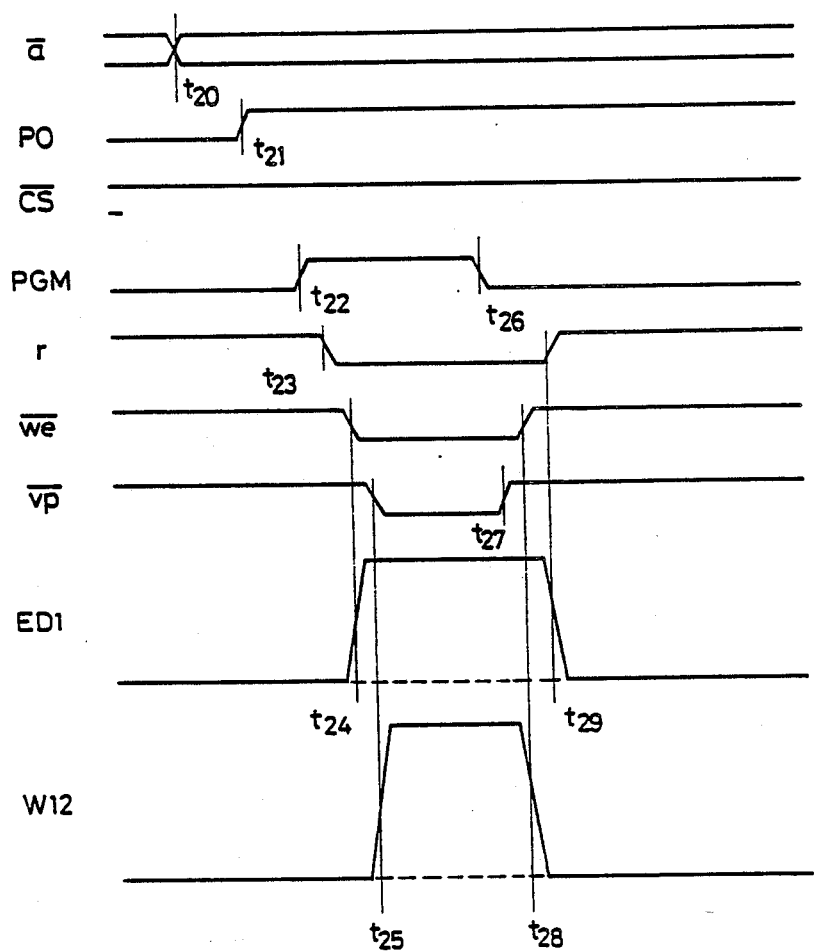

The operation of the semiconductor memory circuit of FIG. 4 is illustrated in the following way with reference to timing charts of FIGS. 5 to 7. FIG. 5 is a timing chart for the reading operation, and FIG. 6 is a timing chart for the erasing operation. FIG. 7 is a timing chart for illustrating the writing operation.

During the reading mode, the writing control signal at the terminal PGM assumes the low level of nearly 0 [V] Further, the potential at the terminal VPP assumes nearly 0 [V] or is floated. Writing and erasing control signal of nearly 0 [V] appear on the drain of the MISFET Q39 which is receiving a voltage VCC of +5 [V] through the gate.

Signals on the control lines r, $\overline{We}$ and $\overline{vp}$ assume the high level and the signal on the control line We assumes the low level, owing to the writing control signal of the low level of the terminal VPP and the writing and erasing signals of the low level of the drain of the MISFET Q39.

Therefore, the reference potential lines ED1 and ED2 of the memory array MA assume the potential of nearly 0 [V] due to the writing inhibit circuit IHA1, and the second word lines W12, W22 also assume the potential of nearly 0 [V] due to the writing circuits WA1, WA2.

Although there is no particular limitation, the timing is set, for example, at a time $t_0$ responsive to memory cells which are selected by the signals introduced through the address input terminals A0 to A10. For example, when the memory cell being selected is MS11, the output of the X decoder XD1 assumes the high level owing to the outputs of the address buffers B0 to B6, and the output of the Y decoder YD1 assumes the high level owing to the outputs of the address decoders B7 to B10.

Consequently, a current path is formed between the drain of the MNOS FET Q1 of the memory cell MS11 and the common digit line CD via MISFET's Q11 and Q10, digit line D1, and switching MISFET Q2. Further, the signal of the high level of the control line r establishes a current path between the common digit line CD and the load MISFET Q47 of the sense circuit IOS.

When the MNOS FET Q1 in the memory cell MS11 is conductive as indicated by the characteristics curve A of FIG. 2, the output line of the sense circuit IOS is grounded via the above-mentioned current path and the MNOS FET Q1. As a result, the output line of the sense circuit IOS assumes the low level. When the MNOS FET Q1 of the memory cell MS11 is non-conductive as indicated by the characteristics curve B of FIG. 2, no current path is formed relative to the load MISFET Q47, whereby the output line of the sense circuit IOS assumes the high level.

At the time $t_1$ shown in FIG. 5, a chip selection signal at the terminal $\overline{CS}$ is converted from the high level to the low level, and a signal on the control line $\overline{CS1}$ assumes the low level at a time $t_2$. Therefore, the output buffer circuit IOR no longer maintains the state of high output impedance, and produces a signal which corresponds to the output level of the sense circuit IOS. For example, when the sense circuit IOS is producing a signal of the high level, the output buffer circuit IOR produces a signal of the high level of the output terminal.

At a time $t_3$, the chip selection signal is converted from the low level to the high level and, at a time $t_4$ the signal of the control line $\overline{CS1}$ is converted from the low level to the high level; accordingly, the output buffer circuit IOR assumes again the state of high output impedance.

To erase information, the writing and erasing signals of +25 [V] are applied beforehand to the terminal VPP, and the chip selection signal of the low level of 0 [V] is applied to the terminal $\overline{CS}$.

The signal on the control line $\overline{vp}$ assumes the high level due to the chip selection signal of the above-mentioned level, and the writing circuits WA1 and WA2 render the second word lines W12, W22 to assume the potential of nearly 0 [V].

As the writing control signal assumes the high level at a time $t_{10}$ as shown in FIG. 6, the output of the NAND circuit NA4 assumes the low level. The low-level signal of the NAND circuit NA4 renders MISFET's Q42 and Q46 in the erasing circuit ERS to be non-conductive; the high voltage of +25 [V] is produced on the output line e.

Since the signals on the second word lines W12, W22 are 0 [V] as mentioned above, the well region WELL assumes the high voltage of +25 [V] due to the output of the erasing circuit ERS, and the high voltage for erasing information is applied to the gate insulation films of MNOS FET's in the memory array.

The positive voltage in the well region works to bias, in the forward direction, the source junction and the drain junction of the MNOS FET Q1 and the switching MISFET Q2 in the memory cell. Therefore, the voltage applied to the well region is decreased provided a current path is formed between the ground terminal of the circuit and at least any one of the reference potential lines ED1, ED2, digit lines D1, D2.

The circuit shown in FIG. 4 operates as mentioned below in order to prevent the voltage of the well region from being decreased.

The signal on the control line r assumes the low level responsive to the writing control signal which assumes the high level nearly at the same time as the above time $t_{10}$.

Due to the signal on the control line r, the MISFET's Q21 and Q24 of the writing inhibit circuit IHA1 and the MISFET Q36 of the writing inhibit voltage generator IHA2 are rendered non-conductive. Consequently, the reference potential lines ED1, ED2 of the memory array are substantially floated.

The signal on the control line We assumes the low level responsive to the low level of the chip selection signal. Therefore, the MISFET Q52 in the data input circuit IOW connected to the common digit line CD remains in the non-conductive state. The MISFET Q48 in the sense circuit IOS connected to the common digit line CD, on the other hand, is rendered non-conductive by the signal of the control line r.

As the common digit line CD is floated, the digit lines D1, D2 in the memory array MA are floated irrespective of the operation of the Y gate YGO.

As the signal at the terminal PGM returns to the low level at a time $t_{11}$, the output of the erasing circuit ERS returns to the low level as well.

The operation for erasing information is carried out under the state in which the chip is selected, while the operation for writing information is carried out under the state in which the chip is not selected, i.e., under the state in which the signals of the terminal $\overline{CS}$ is of the low level. To carry out the writing operation, writing and erasing signals of +25 [V] are applied beforehand to the terminal VPP.

Referring to FIG. 7, an address signal $\overline{a}$ is set at a time $t_{20}$ to select, for example, the memory cell MS11. Namely, the first word line W11 assumes the high level owing to the X decoder XD1, and the line Y1 assumes the high level owing to the Y decoder YD1.

At a time $t_{21}$, information to be written is applied to the terminal PO. When information to be written is "0", the terminal PO assumes the potential 0[V], whereby the MISFET Q51 of the data output circuit IOW receives a signal of the high level of +5 [V] from the input buffer circuit IN16, and is rendered conductive. When information to be written is "1", i.e., when information to be written is +5 [V], the MISFET Q51 is rendered non-conductive by the output 0 [V] produced by the input buffer circuit IN16.

As the writing control signal at the terminal PGM assumes the high level at a time $t_{22}$, the signal of the control line r assumes the low level at a time $t_{23}$, lagging slightly behind the time $t_{22}$ due to the inverters IN1, IN2 or NOR circuit NR2 in the control circuit CRL. Consequently, MISFET's Q21, Q24 of the writing inhibit circuit IHA1, MISFET Q36 of the writing inhibit voltage generator IHA2, and MISFET Q48 of the sense circuit IOS are rendered non-conductive.

The signal of the control line $\overline{We}$ assumes the low level at a time $t_{24}$ which lags slightly behind the time $t_{23}$. Responsive to the signal of the control line $\overline{We}$, the writing inhibit voltage generator IHA2 produces a high voltage of about +20 [V] applied to the line IHV, whereby the reference potential lines ED1, ED2 of the memory array assumes the potential of +20 [V].

The signal of the control line We assumes the high level at nearly the same time as the time $t_{24}$. Accordingly, the MISFET Q52 in the data input circuit IOW is rendered conductive. At the same time, MISFET's Q15 in the writing circuits WA1, WA2 are turned on.

As the signal of the output line IHV in the writing inhibit voltage generator IHA2 assumes a sufficiently high voltage, the control circuit CRL which receives the signal of the line IHV produces a signal of the low level which is applied to the control line $\overline{vp}$ at a time $t_{25}$. The signal of the control line $\overline{vp}$ initiates the writing as will be described below. Namely, with the signal for initiating the writing being produced after the signal of the line IHV has assumed a sufficient writing inhibit level, it is possible to prevent information from being erroneously written on the memory cells which are not selected.

Due to the low-level signal of the control line $\overline{vp}$, the MISFET Q18 in the writing circuits WA1, WA2 is rendered non-conductive. Since the first word line W11 has been selected to assume the potential of about +5 [V], the writing circuit WA1 produces a high voltage of about +25 [V] which is applied to the second word line W12.

Since the first word line W21 is not selected and is at the potential of nearly 0 [V], the writing circuit WA2 produces the output of nearly 0 [V] which is applied to the second word line W22.

The MNOS FET Q1 in the memory cell MS11 that is to be selected is coupled to the MISFET Q51 which receives the output of the input buffer circuit IN16, via switching MISFET Q2, digit line D1, MISFET's Q12, Q11 of the Y gate YG0, common digit line CD and MISFET Q52. When information to be written is "1", the MISFET Q51 which is rendered conductive causes the drain and source of the MNOS FET Q1 in the memory cell MS11 to assume the potential of nearly 0 [V], and electrons are injected into the gate insulation film due to the high voltage of the gate (second word line W22). When information to be written is "0", the MISFET Q51 which is in the non-conductive state causes the source and drain of the MNOS FET Q1 in the memory cell MS11 to assume the voltage +20 [V] which is produced by the writing inhibit voltage generator IHA2. Therefore, no electrons are injected. Since the signal of the second word line W22 is nearly 0 [V], no information is written on the memory cell MS21 of another row which is connected to the same digit line D1.

Another digit line D2 is maintained at +20 [V] by the output of the writing inhibit voltage generator IHA2 since the MISFET Q13 in the corresponding Y gate YG0 is non-conductive.

As the writing control signal at the terminal PGM assumes the low level at a time $t_{26}$, the signals on the control lines $\overline{vp}$, $\overline{We}$, r assume the high level at times $t_{27}$, $t_{28}$ and $t_{29}$ as shown in FIG. 7. The signals on the second word line W12 and the reference potential line ED1 assume the level of nearly 0 [V], correspondingly.

The semiconductor memory circuit according to the present information can be constructed to have a capacity which is relatively as great as, for example, 16 kilobits.

Figure 8:
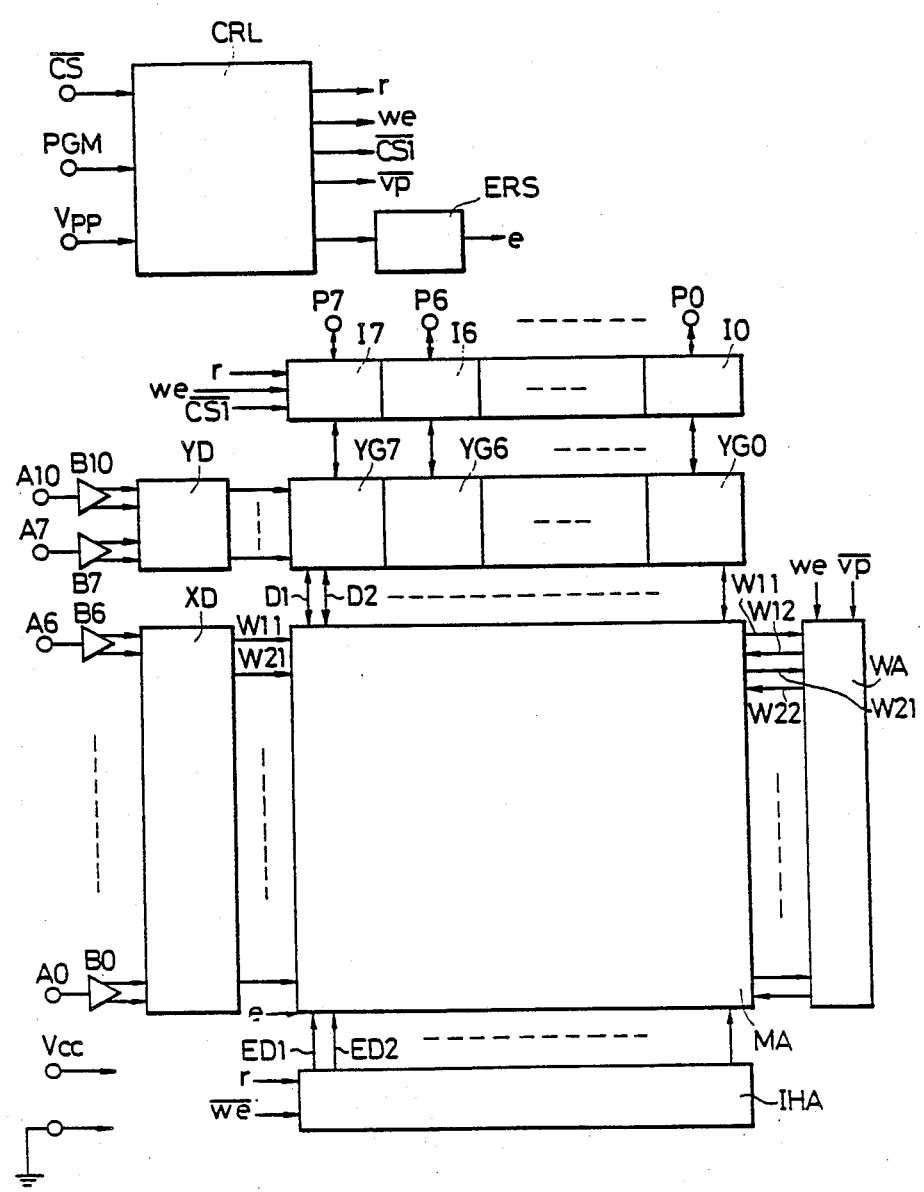
FIG. 8 is a block diagram of a semiconductor memory circuit employing the circuit of FIG. 4.

FIG. 8 is a block diagram of the semiconductor memory circuit employing the circuit of FIG. 4.

Referring to FIG. 8, the memory array MA contains, for example, 16,384 bits of memory cells which are arrayed in 128 rows × 128 columns. The memory array MA is equipped with the X decoder XD which selects memory cells of 128 rows upon receipt of address input signals of 7 bits from the address buffers B0 to B6. There are further provided eight Y gates YG0 to YG7, each of which selects 16 columns of memory cells. These Y gates are controlled by the Y decoder YD which receives address input signals of 4 bits from the address buffers B7 to B10. The Y gates YG0 to YG7 are provided with input/output circuits I0 to I7 which include the sense circuit, the output buffer circuit and the data input circuit that are illustrated in FIG. 4. There is provided a writing inhibit circuit IHA which includes MISFET's Q20 to Q22 as shown in FIG. 4 for each of the columns of memory cells, and which further contains a writing inhibit voltage generator, and writing circuits WA are provided for the rows of memory cells. There are further provided a control circuit CRL and an erasing circuit ERS.

Therefore, the semiconductor memory circuit of FIG. 8 stores information consisting of 11 bits, i.e., stores information consisting of 8 bits in 2048 addresses.

As mentioned above, the X decoder can be simply constructed by constituting the memory cells using MNOS FET's and switching MISFET's, and by forming the X decoder independently of the writing circuit. Therefore, the word lines can be selected by the X decoder at a high speed, making it possible to provide a memory circuit which features high-speed operation.

Sources of MISFET's Q22 and Q25 in the writing inhibit circuit may be connected to the digit lines D1, D2 instead of the reference potential lines ED1, ED2 which are shown in FIG. 4. Even the above-mentioned connection enables the writing inhibit voltage to be fed to the memory array. In this case, however, attention should be given to the fact that stray capacitance such as junction capacitance of MISFET's Q22 and Q25, interconnection capacitance, and the like, is coupled to the digit lines D1, D2, so that a limitation is imposed on the speed of changing the signals of the digit lines when the stored information is being read out, or information is being written down. When the MISFET's Q22 and Q25 are connected to the reference potential lines ED1, ED2 as shown in FIG. 4, the speed for changing the signals of the digit lines can be increased.

The above-mentioned circuits are formed on a semiconductor substrate by the semiconductor integrated circuit technique.

According to the present invention, the above circuits are so arrayed on the semiconductor substrate that the circuit characteristics are not restricted, and the size of the semiconductor substrate being employed is not increased.

Figure 9:
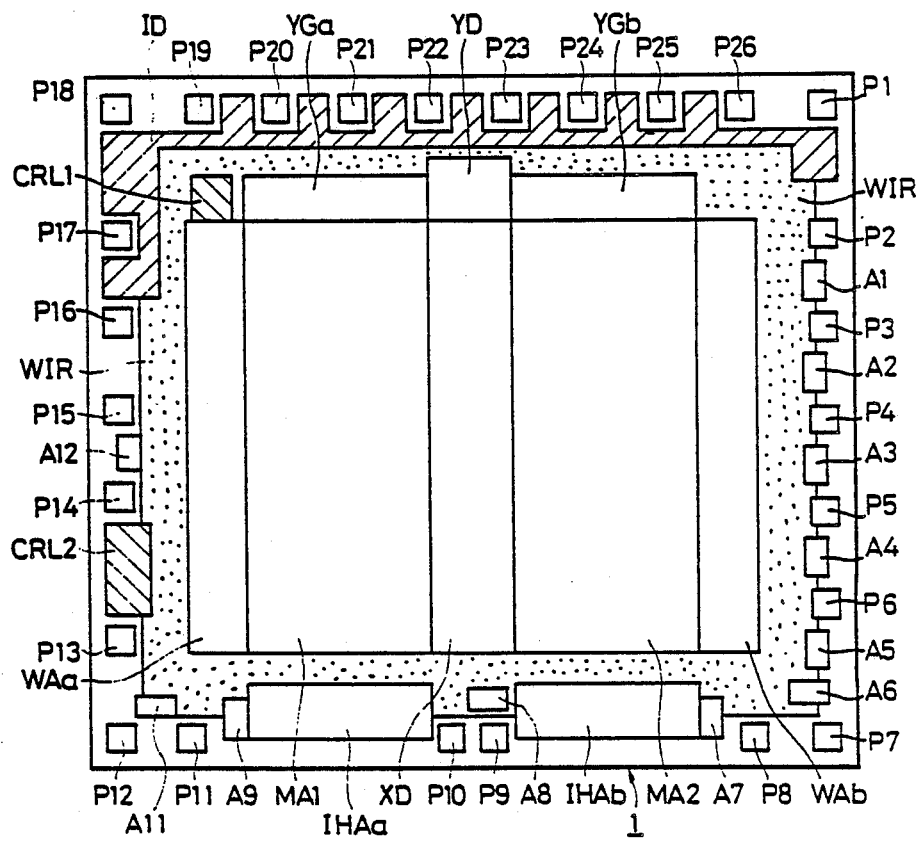
FIG. 9 is a plan view of the semiconductor memory circuit device according to the present invention.

FIG. 9 illustrates patterns for the circuits and wiring formed on the silicon substrate 1.

The X decoder XD is arrayed at the center on the surface of the substrate 1. The memory array is divided into two groups MA1 and MA2, the one group MA1 being arrayed on the left side of the X decoder XD and the other group MA2 being arrayed on the right side of the X decoder XD.

On the left side of the memory array MA1 is formed a writing circuit WAa, and on the right side of the memory array MA2 is formed a writing circuit WAb.

On the upper side of the memory array MA1 is formed a Y gate TGa, and on the upper side of the memory array MA2 is formed a Y gate YGb. A Y decoder YD is disposed between the Y gate YGa and the Y gate YGb, i.e., the Y decoder YD is disposed on the upper side of the X decoder XD.

As indicated by the dotted area, a wiring region WIR is formed around the memory arrays, X decoder, writing circuits, Y gates and Y decoders.

Writing inhibit circuits IHAa and IHAb are disposed beneath the memory arrays MA1 and MA2 with the wiring region WIR being interposed therebetween.

On the surface around the substrate 1 are formed an input/output circuit I0, control circuits CRL1 and CRL2, and input buffer circuits A1 to A12. On the surface around the substrate 1 are further formed bonding pads P1 to P26 for connecting various input terminals and output terminals to the terminals of external units.

To form the circuit of FIG. 8, each of the memory arrays MA1 and MA2 has a size of 128 rows ×64 columns. The first corresponding word lines in the memory arrays MA1 and MA2 are simultaneously selected by the X decoder XD. The input line to the X decoder XD is connected via wiring in the wiring region WIR to the input buffer circuits which are arrayed around the substrate 1.

Responsive to the output of the Y decoder YD, the Y gates YGA and YGb simultaneously select the digit lines of the corresponding memory arrays MA1 and MA2. The Y gates YGa and YGb are connected to the input/output circuit I0 via wiring in the wiring region WIR.

The writing inhibit circuits IHa and IHb are connected to the reference potential lines of the memory arrays MA1 and MA2 via wirings in the wiring region WIR.

According to the embodiment of the present invention as mentioned in the foregoing, well regions are used for the memory arrays and for the peripheral circuits.

Figure 10:
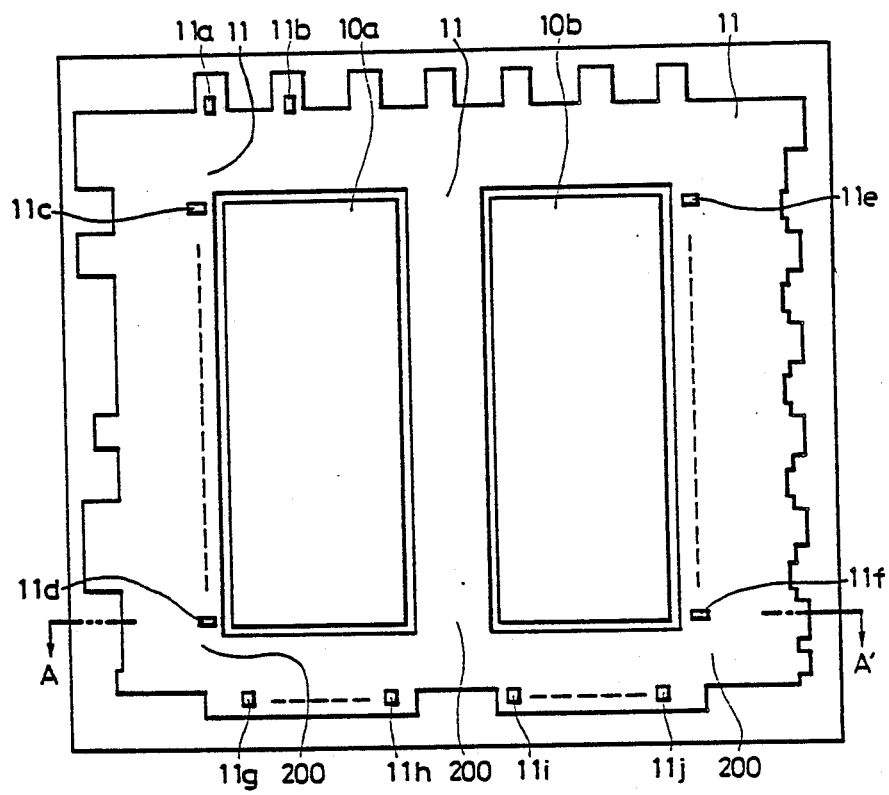
FIG. 10 is a plan view of a semiconductor substrate for forming the semiconductor memory circuit device of FIG. 9.
Figure 11:
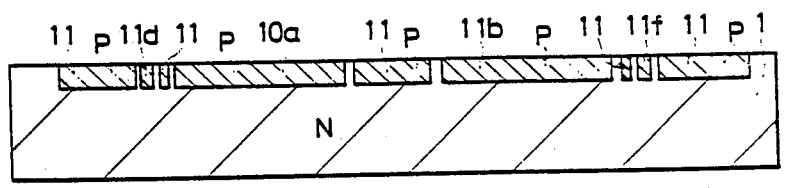
FIG. 11 is a cross-sectional view along the line A—A' of FIG. 10.

FIG. 10 illustrates a well region pattern which is formed on the surface of the silicon substrate 1 to correspond to the circuit arrangement of FIG. 9. FIG. 11 is a cross-sectional view along the line A—A' of FIG. 10.

Referring to FIGS. 10 and 11, p-type well regions 10a and 10b are formed independently of each other on the surface of the n-type silicon substrate 1 to form the memory arrays.

A p-type well region 11 is formed around the well regions 10a, 10b in order to form peripheral circuits such as X decoders, Y decoders, Y gates, writing circuits, writing inhibit circuits, input/output circuits, input buffer circuits and control circuits.

On the upper side of FIG. 10 are formed independent well regions 11a and 11b which are indicated on an exaggerated scale and which are separated from the p-type well region 11, in order to form MISFET's which connect the source to the substrate gate, like the MISFET Q49 in the output buffer circuit IOR of FIG. 4.

On the left side of the p-type well region 10a and on the right side of the p-type well region 10b are formed independent p-type well regions 11c to 11d and 11e to 11f in order to form MISFET's like the MISFET Q19 in the writing circuit WA1 of FIG. 4. Beneath the paper of FIG. 10 are formed p-type well regions 11g to 11h and 11i to 11j, which are independent of other p-type well regions, in order to form MISFET's which require independent substrate gates like the writing inhibit circuit IHA1 and writing inhibit voltage generator IHA2 of FIG. 4.

Though not illustrated in FIG. 10 or FIG. 11, the n-type silicon substrate 1 is exposed at a predetermined portion in the p-type well region 11 to form a MISFET as will be mentioned later.

According to this embodiment as mentioned above, a variety of p-type well regions are formed on the n-type silicon substrate 1, whereby it is possible to form various effective elements such as transistors to construct a semiconductor memory circuit device.

For example, channel stoppers for preventing parasitic channels are formed as will be mentioned later by the ion implantation on the surface of the n-type silicon substrate 1 among the plurality of p-type well regions, and are effectively utilized.

Figure 12:
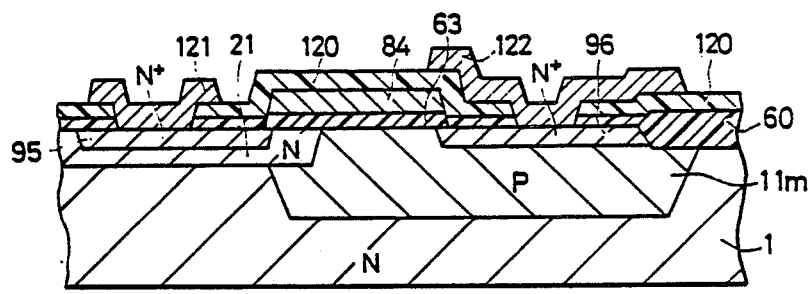
FIG. 12 is a cross-sectional view of the semiconductor substrate on which is formed a MISFET.

FIG. 12 is a cross-sectional view of a MISFET which features high withstand voltage characteristics, in which reference numeral 11m denotes a p-type well region, 21 denotes an n-type channel stopper which is formed in the surface of the substrate 1 so as to stretch into a portion of the well region 11m, 95 and 96 denote an n+-type drain region and source region, 63 denotes a gate insulation film composed of silicon oxide, 60 denotes a thick silicon oxide film which covers the surfaces of the substrate 1 and the well regions other than the regions which form elements such as MISFET's, 84 denotes a gate electrode composed of an n-type polycrystalline silicon, 120 denotes an insulation film composed of a phosphorus silicate glass, and 121 and 122 denoted a drain electrode and a source electrode composed of vaporized aluminum.

In FIG. 12, a substantial drain region of the MISFET is composed of the region 95 for contacting the electrode 121 and the channel stopper 21. The channel stopper 21 works to prevent the parasitic channels from being induced on the surface of the n-type substrate 1, and has a relatively small concentration of impurities. Therefore, the channel stopper 21 of a portion which is stretched onto the p-type well region 11m acquires a resistivity which is sufficiently greater than that of the region 95 which is contacted to the electrode 121. The MISFET of FIG. 12 utilizes the channel stopper as a portion of the drain region as mentioned above, and features a great drain withstand voltage.

According to the embodiment of the present invention, therefore, the n-type substrate 1 is connected to the high-voltage terminal VPP (refer to FIG. 4), and the MISFET of which the drain is connected to the high-voltage terminal VPP is utilized as a MISFET of the construction as illustrated in FIG. 12. In other words, the depression-type MISFET's Q26, Q29 and Q32 in the writing inhibit voltage generator IHA2, the depression-type MISFET's Q19 in the writing circuits WA1, WA2, the depression-type MISFET's Q40 and Q43 in the erasing circuit ERS, and the enhancement-type MISFET Q37 in the level shift circuit in the control circuit CRL or in the voltage dividing circuits Q37 to Q39 in FIG. 4, are constructed in a way as illustrated in FIG. 12.

As will become obvious from the subsequent description, the depression-type MISFET's are formed by implanting the n-type impurities such as phosphorus ions into the surface of the p-type well region 11m which is located beneath the gate electrode 84.

Figure 13:
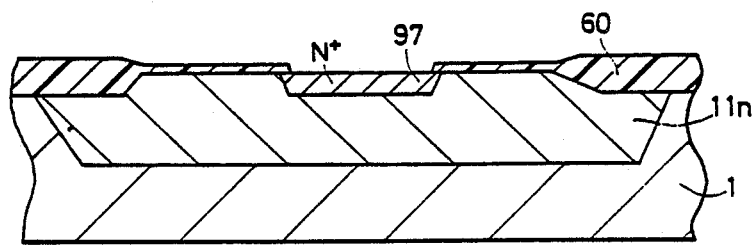
FIG. 13 is a cross-sectional view of the semiconductor substrate on which is formed a bipolar transistor.

FIG. 13 is a cross-sectional view of an npn transistor, in which the n-type substrate 1 serves as a collector region for the transistor, the p-type well region 11n serves as a base region, and the n+-type region 97 serves as an emitter region. The n+-type region 97 is formed simultaneously with the region for forming the source region and drain region of the MISFET. The npn transistor is employed for the erasing circuit ERS of FIG. 4.

The MNOS FET's and MISFET's may be so constructed as to possess an aluminum gate, but should preferably be so constructed as to possess a silicon gate as mentioned earlier.

Therefore, prior to illustrating the construction of elements and wirings for forming the circuits by the silicon gate technique, below is described a method of manufacturing the elements and wirings so that the invention can be easily comprehended.

Below is described in detail a process for forming a MNOS FET, an enhancement-type MOS FET (enhancement-type metal-oxide-semiconductor field effect transistor), a depression-type MOS FET and a bipolar transistor on a piece of a semiconductor substrate with reference to FIGS. 14A to 14O.

(A) A silicon wafer of the n-type single crystal having a crystal surface (100) and a resistivity of 8 to 12 ohms/cm (an impurity concentration of about $5 \times 10^{14}$ cm$^{-3}$) is used as a substrate wafer 1. To form the well having a low impurity concentration maintaining good reproduceability, the resistivity of the wafer should be as great as possible (the impurity concentration should be small). In this embodiment of EAROM (electrically alterable read only memory), however, the silicon wafer having an impurity concentration of the above-mentioned degree is employed since the impurity concentration in the well has been selected to be about $3 \times 10^{15}$ cm$^{-3}$.

After the surface of the silicon wafer 1 is washed using a suitable washing liquid (an $O_3$—$H_2SO_4$ liquid or an HF liquid), a silicon oxide ($SiO_2$) film 2 is formed to a thickness of about 50 nm by the thermal oxidation method, and a silicon nitride ($Si_3N_4$) film 3 is formed to a thickness of about 100 to 140 nm by the CVD (chemical vapor deposition) method, as shown in FIG. 14A. The $Si_3N_4$ film was formed by using a vertical CVD apparatus which effects the reaction under ordinary pressure, using a lateral CVD apparatus which effects the reaction under ordinary pressure, using a lateral CVD apparatus which effects the reaction under reduced pressure, and the like. There was found no serious difference in the $Si_3N_4$ film. The film formed by using the low-pressure CVD apparatus, however, exhibited the greatest uniformity in the film thickness, which was within ±3% in the wafer, so that the film could be finely machined in the subsequent steps. A preferred deposition temperature ranges from 700° to 1000° C. although it slightly varies depending upon the method. The results were the same even for forming the $Si_3N_4$ film.

(B) Then, a photoresist film 4 is formed on the $Si_3N_4$ film 3 only on the portions (between well and well) except the regions where wells will be formed by the photoetching method. Namely, the $Si_3N_4$ film 3 is exposed on the surfaces of the regions where the wells will be formed. Under this state, the $Si_3N_4$ film of the exposed portions is removed by the plasma etching method, so that the $SiO_2$ film 2 is exposed as shown in FIG. 14B. Thereafter, utilizing the photoresist film 4 as a mask, boron ions are implanted at an implanting energy of 75 KeV and in a total dosing quantity of $3 \times 10^{12}$/cm$^2$ into the silicon substrate of portions without the photoresist film through the exposed $SiO_2$ film 2, thereby to form p-type semiconductor regions 5 and 6.

(C) After the resist film 4 has been removed, wells are formed by diffusion in an atmosphere of dry oxygen. Boron atoms serve as impurities in the form of acceptor in silicon; therefore, a p-type well is formed. When diffused at 1200° C. for 16 hours, the resulting p-type wells 10, 11 have a surface concentration of about $3 \times 10^{15}$ cm$^{-3}$ and a diffusion depth of about 6 μm. These values, however, are found from the measurement of surface resistivity by the four-probing method and from the measurement of diffusion depth by the stained etching method, based on the assumption that the impurities in the well assume a Gaussian distribution. The diffusion is carried out in the oxygen atmosphere in order to form uniform wells of a low concentration.

After the well diffusion has been completed, $SiO_2$ films 12, 13 of a thickness of about 0.85 μm will have been formed on the surfaces of the well regions 10, 11, and an oxide film of about 50 nm will have been formed on the $Si_3N_4$ film 3. After the $SiO_2$ film of a thickness of about 50 nm is removed by the etching, silicon oxide films 12, 13 of a thickness of about 0.8 μm are left on the surface of the wells, and the $Si_3N_4$ film 3 is exposed between the wells, as illustrated in FIG. 14C.

(D) Referring to FIG. 14D, the $Si_3N_4$ film 3 is removed by etching using, for example, a hot phosphoric acid solution ($H_3PO_4$), such that $SiO_2$ films 14, 15 and 16 of a thickness of about 50 nm that were initially formed, are exposed among the wells. In this state, the $SiO_2$ film of a thickness of about 0.8 μm is formed on the wells, and the $SiO_2$ film of a thickness of about 50 nm is formed among the wells. Under this condition, phosphorus ions are implanted into the entire surfaces at an energy of 125 KeV in a dosing amount of $1 \times 10^{13}$ cm$^{-2}$. In this case, since thick $SiO_2$ films 12, 13 on the wells serve as masks, phosphorus ions are not implanted into the wells except the peripheral portions of the well regions, and phosphorus ions are implanted among the wells, such that n-type semiconductor regions 20, 21 and 22 are formed. During the diffusion step, the wells also spread in the lateral directions from the end portion of the $Si_3N_4$ film that was used as a mask when the wells were being diffused, giving rise to the occurrence of difference in height of about 6 μm between the end portion of the $Si_3N_4$ film (end portion of the thick $SiO_2$ film on the wells) and the end portion of the wells. In other words, the layer in which phosphorus ions are implanted is formed up to about 6 μm in the well as measured from the end portion of the well. Furthermore, the layer in which phosphorus ions are implanted has a depth of about 1 μm if it is measured after the final heating step has been completed.

Thus, since the electrical conductivity among the p-type wells can be prevented by implanting phosphorus ions among the wells in a self-aligned manner, the layers 20, 21 and 22 in which phosphorus ions are implanted are hereinafter referred to as SAP (self aligned p-channel field ion implantation) layers.

According to the above-mentioned method by which the p-type well diffusion regions are formed by the heat treatment in an oxidizing atmosphere using the $Si_3N_4$ film as a mask, and SAP layers are formed to prevent the occurrence of parasitic channels among the wells by implanting n-type impurities in the surface of the n-type substrate among the wells using thick oxide film formed on the wells as a mask, it is possible to implant ions among the wells without increasing the number of masks, as well as to form the well diffusion regions and the ion-implanted layers among the wells in a self-aligned manner. This technique is hereinafter referred to as SAP method which is one of the major features of the present invention.

Thereafter, the $SiO_2$ films 12, 13, 14, 15 and 16 are all removed from the surface of the silicon substrate. In this state, n-type regions 20, 21 and 22 are formed on the surface of the silicon substrate, the n-type regions 20, 21 and 22 having impurity concentrations which are greater than the concentrations of n-type impurities of the p-type well regions 10, 11 and of the substrate. Furthermore, a stepped portion 17 of about 0.4 to 0.5 μm is formed at the boundary among the above-mentioned regions. By utilizing the stepped portion, masks can be aligned in the subsequent step of photoetching.

Thereafter, a step of a so-called LOCOS (local oxidation of silicon) oxidation is carried out.

(E) After the $SiO_2$ film has been removed from the entire surfaces of the silicon substrate as mentioned above, an $SiO_2$ film 24 of a thickness of about 50 nm is formed on the entire surfaces of the substrate by the thermal oxidation method. Thereafter, as $Si_3N_4$ film of a thickness of 100 to 140 nm is formed on the $SiO_2$ film by the CVD method.

Then, the photoresist film is left only on predetermined regions for forming the active elements relying upon the photoetching method (as indicated by 35, 36, 37, 38, 39 and 40 in FIG. 14E). In this state, the photoresist film is removed and the $Si_3N_4$ film is exposed on the surfaces where a thick oxide film must be formed to isolate the elements. The plasma etching is then effected to remove the exposed $Si_3N_4$ film, such that the $SiO_2$ film 24 of a thickness of about 50 nm that was previously formed is exposed. Namely, the $Si_3N_4$ films 25, 26, 27, 28, 29 and 30 beneath the photoresist films 35, 36, 37, 38, 39 and 40 are left. Thereafter, using the photoresist films as masks, boron ions are implanted at an energy of 75 KeV in a total dosing amount of $2 \times 10^{13}$ cm$^{-2}$ into the silicon substrate of portions of without the photoresist film through the exposed $SiO_2$ film 24, thereby to form p-type semiconductor layers 41, 42, 43, 44, 45 and 46. In this case, the portions where the depressions-type MISFET's of high withstand voltage must be formed, are so designated that the end portions of the $Si_3N_4$ film are located in the SAP implanted layer at the end portions of the wells. Therefore, the active region is formed spanning between the SAP layer 21 and the well as shown in FIG. 14E. The implantation of boron ions is hereinafter referred to as field implantation.

(F) After the resist film has been removed, the field oxidation is effected in a wet oxygen atmosphere at a temperature of 1000° C. for about 4 hours, so that an $SiO_2$ film 60 of about 0.95 μm is formed on the surface of the silicon substrate in a portion from which the $Si_3N_4$ film has been removed. Phosphorus ions by the SAP (self aligned p-channel field ion implantation) and boron ions by the field implantation are present in a mixed state in the portions where a thick field oxide film of about 0.95 μm in thickness is formed among the wells, i.e., phosphorus ions and boron ions are present in a mixed manner in the surface of the n-type region 20 shown in FIG. 14F. Here, phosphorus ions are present in an amount of $1 \times 10^{13}$ cm$^{-2}$ which is smaller than the amount of boron ions of $2 \times 10^{13}$ cm$^{-2}$. In effecting the field oxidation, however, boron ions are segregated in large amounts into the silicon dioxide. In other words, boron ions in silicon are depleted in the interface with respect to $SiO_2$. Phosphorus ions in silicon, however, are piled up (accumulated) in the interface with respect to the silicon dioxide (refer to FIGS. 15 and 16). Finally, therefore, the surfaces among the wells have a large phosphorus concentration, and sufficiently work as channel stoppers. Thus, by suitably utilizing the difference in behaviour of the phosphorus ions and boron ions in the $SiO_2$ interface relying upon the SAP method and the LOCOS process, the phosphorus ions can be implanted (which is necessary for forming the drain of the depression-type MISFET having a high withstand voltage, that will be described later) at a concentration as small as possible without requiring the step of masking, and boron ions can be implanted (which is necessary for maintaining a relatively high threshold voltage for the parasitic MISFET) in a dosing amount greater than that of phosphorus ions, so that there is finally established a processing technique which is capable of maintaining a high phosphorus concentration. Thus, p-type semiconductor regions 51 to 56 are formed beneath thick oxide films formed on the surface of the substrate to correspond to the p-type ion implanted layers 41 to 46 which are shown in FIG. 14E, the p-type semiconductor regions 51 to 56 having a surface impurity concentration which is greater than the impurity concentrations in the surface of the p-type well diffusion regions.

Immediately after the field oxidation has been completed, $Si_3N_4$ films 25 to 30 of a thickness of about 100 to 140 nm are formed on an $SiO_2$ film 24 of a thickness of about 50 nm in the active region, and oxide films of a thickness of about 20 nm are further formed on the surfaces of the $Si_3N_4$ films 25 to 30, and an $SiO_2$ film 60 of a thickness of about 0.95 μm is formed in the filed region.

(G) After the $SiO_2$ films of the thickness of about 50 nm are removed from the entire surfaces by the etching, the $SiO_2$ film 60 of the thickness of about 0.9 μm is left on the field region, and the $SiO_2$ film 24 of the thickness of 50 nm and the $Si_3N_4$ films 25 to 30 of the thickness of 100 to 140 nm are left on the active region, whereby the $Si_3N_4$ films are exposed. The $Si_3N_4$ films 25 to 30 are then removed by using, for example, a hot phosphoric acid ($H_3PO_4$) solution. Therefore, the previously formed $SiO_2$ film 24 of the thickness of about 50 nm is left on the active region, so that the $SiO_2$ film 24 can be used as a gate oxide film for the active MOSFET's, i.e., for the depression-type MOSFET's and the enhancement-type MOSFET's. However, the gate withstand voltage often tends to be decreased by abnormal regions (which usually are assumed to be an $Si_3N_4$ film) which form at the end portions of LOCOS. As illustrated in FIG. 14G, therefore, the thin oxide film 24 and the $Si_3N_4$ film formed thereon are once removed, and the $SiO_2$ film of a thickness of 45 nm is formed and is removed repetitively. Thereafter, as illustrated in FIG. 14H, $SiO_2$ films 62 to 67 of a thickness of about 75 nm which will be practically used as gate insulation films, are formed in a dry oxygen atmosphere being heated at 1000° C. for 110 minutes.

(H) In order to set a threshold voltage of the enhancement-type MOSFET's among a plurality of MOSFET's, boron ions are implanted into the entire surfaces through the thin gate insulation films 62 to 67 at an energy of 40 KeV in a total dosing amount of $2 \times 10^{11}/cm^2$ (regions 71 to 76 shown in FIG. 14H). The enhancement-type MOSFET referred to here has a high threshold voltage and permits very little current to flow when the gate voltage is 0 [V]. As a matter of course, boron ions are not implanted into the field region which has a thick oxide film, but are implanted into the surface of the silicon substrate through the $SiO_2$ films 62 to 67 of the thickness of about 75 nm in the active region.

(I) The EAROM mentioned in this embodiment helps the peripheral circuits operate at high speeds relying upon the E/D inverters. Therefore, in addition to the above-mentioned enhancement-type MOSFET's, it is necessary to form depression-type MOSFET's. The depression-type MOSFET's referred to here have a small threshold voltage and permit drain current to flow when the gate voltage is 0 [V]. To form the depression-type MOSFET's on the predetermined portions, a photoresist film is formed on the $SiO_2$ films 60, 62 to 67, the photoresist film is removed from the regions where the depression-type MOSFET's will be formed as shown in FIG. 14I, the photoresist film is left in other portions to use it as a mask as denoted by 80, and phosphorus ions are implanted into the predetermined portions only to set a threshold voltage for the depression-type MOSFET's. Phosphorus ions in this embodiment were implanted at an implanting energy of 100 KeV and in a dosing amount of $1.2 \times 10^{12}/cm^2$. This holds true for a region of a high-withstand-voltage DMISFET (region 81 shown in FIG. 14I). Thus, by forming depression-type MOSFET's on the surface in the boundary around the wells formed by the SAP method among the wells, it is possible to form non-volatile memory transistors, i.e., MNOSFET's as well as high-withstand-voltage depression-type MISFET's on the same chip without the need of increasing the photomasks, as will become more apparent from the subsequent description.

(J) Next, after the photoresist film 80 has been removed, a polycrystal silicon layer is formed to a thickness of about 0.35 μm on the $SiO_2$ film by the CVD method at a temperature of about 580° C. For the purpose of comparison, the polycrystal silicon layer is formed under ordinary pressure and under reduced pressure. There is, however, no significant difference in characteristics except that the latter method exhibits excellent uniformity in the film thickness. The polycrystal silicon layer is then doped with phosphorus ions by the diffusion method. The doping conditions in this case consist of depositing phosphorus ions from a $POCl_3$ source onto the surface of the polycrystal silicon layer to diffuse them at a temperature of 1000° C. for 20 minutes, and spreading the phosphorus ions on the surface such that the resistivity of the polycrystal silicon layer is about 15 ohms/$cm^2$.

Therefore, the phosphorus glass formed on the surface of the polycrystal silicon layer is removed by etching using a liquid containing, for example, hydrogen fluoride, the photoresist is left only on the predetermined portions by the photoetching method, and the polycrystal silicon layer is removed except the portions where the photoresist is left by the plasma etching method. Consequently, gate electrodes 83 and 84 consisting of polycrystal silicon of the first layer are formed on the $SiO_2$ film as illustrated in FIG. 14J.

Then the gate oxide film 62 is subjected to the selective etching using the first polycrystal silicon layers 83, 84 as masks, so that the surface of the substrate is locally exposed as shown in FIG. 14J.

(K) The oxidation is then effected in a wet oxygen atmosphere at a temperature of 850° C. for 20 minutes, to form an $SiO_2$ film 87 of a thickness of about 40 nm on the exposed surface of the silicon substrate as well as to form $SiO_2$ films 85 and 86 of a thickness of about 200 nm on the surface of the polycrystal silicon layer as shown in FIG. 14K. Thereafter, the entire surfaces of the $SiO_2$ film are subjected to the etching to remove the $SiO_2$ film of a thickness of about 60 nm, such that an $SiO_2$ film of a thickness of about 140 nm is left on the polycrystal silicon layer. Thus, in order to form a thick oxide film on the polycrystal silicon layer, and to form a sufficiently thin oxide film on the surface of the silicon substrate, it is necessary to have the polycrystal silicon layer impregnated with phosphorus ions at a concentration of at least greater than $10^{20}$ $cm^{-3}$, and to perform the oxidation at a temperature within a range of 600° to 1000° C. in the wet oxygen atmosphere.

(L) Then, utilizing the $SiO_2$ films 85 and 86 left on the polycrystal silicon layer as masks, the exposed surfaces of the silicon substrate are subjected to slight etching using an etching solution which contains $NH_3$—$H_2O_2$ and $HCl$—$H_2O_2$. In this case, the $SiO_2$ film 85 works to prevent the first polysilicon layer which is doped to a high concentration from being etched.

Thereafter, a thin $SiO_2$ film 88 of a thickness of about 2 nm is formed by the oxidation in an oxygen atmosphere which is diluted with nitrogen at a temperature of 850° C. for 120 minutes, and then an $Si_3N_4$ film 90 of a thickness of about 50 nm is formed by the CVD method. The $Si_3N_4$ film mentioned above was formed according to a variety of methods for the purpose of comparison. In any case, however, there was no problem with regard to the characteristics after they have been subjected to a high-temperature annealing in hydrogen atmosphere, as will be mentioned later.

Then, a second polycrystal silicon layer is deposited to a thickness of about 0.3 μm on the $Si_3N_4$ film 90, and is treated by the photoetching method as shown in FIG. 14L, thereby to form a gate electrode 91 consisting of the second polycrystal silicon layer. Using gate electrodes 91, 83, 84 and the thick $SiO_2$ film 60 as masks, phosphorus ions are implanted into the silicon substrate at an implanting energy of 90 KeV in a dosing amount of $1 \times 10^{16}$ $cm^{-2}$, to form n+-type semiconductor regions 92 to 100 that can be used as source and drain regions. At the same time, the second gate electrode (polycrystal silicon layer) 91 is doped with phosphorus ions. In this case, the first polycrystal silicon layers 83, 84 will have already been doped with phosphorus ions resulting in the increase in the size of the crystalline particles. Therefore, phosphorus ions are likely to be implanted into the surface of the silicon substrate beneath the polycrystal silicon layers 83, 84. As mentioned above, however, since the $SiO_2$ films 85, 86 of the thickness of about 140 nm and the $Si_3N_4$ film 90 of the thickness of 50 nm have been formed on the polycrystalline silicon layers 83, 84, the phosphorus ions are not implanted into the surface of the silicon substrate. Thus, the silicon substrate of the construction shown in FIG. 14L is obtained.

(M) Next, using the $Si_3N_4$ film 90 formed beneath the gate electrode 91 as a mask, the surface of the gate electrode 91 is oxidized in a wet atmosphere at a temperature of, for example, 850° C. for 10 minutes. Using the oxide film ($SiO_2$ film) 102 as a mask, the $Si_3N_4$ film 90 is selectively removed. The second polycrystalline silicon layer (gate electrode 91) which is doped to a high concentration is protected by the $SiO_2$ film 102 formed thereon from an etching solution for treating the $Si_3N_4$ film. On the other hand, the first polycrystalline silicon layers (gate electrodes 83, 84) are protected from the etching solution for treating the $Si_3N_4$ film by the $SiO_2$ films 85, 86 that were formed prior to the formation of the $Si_3N_4$ film 90.

Under this condition, however, the withstand voltage is poor between the gate electrode 91 and the source region or the drain region. In other words, the gate insulation voltage is small. Therefore, the oxidation is effected in a wet atmosphere at 850° C. for 30 minutes to increase the gate insulation voltage. At the same time, shapes at the end portions of the gate electrodes 83, 84 are improved to increase the withstand voltage. Under this condition as illustrated in FIG. 14M, the $SiO_2$ films 85, 86 of a thickness of about 0.3 $\mu$m are formed on the gate electrodes 83, 84. Furthermore, $SiO_2$ films 102, 104 to 112 of a thickness of about 0.2 $\mu$m are formed on the gate electrode 91 and on the $n^+$-type semiconductor regions 92 to 100.

According to the above-mentioned method, the MOS (metal-oxide-semiconductor) structure is formed using a material such as polycrystalline silicon which withstands high temperatures as a gate electrode as shown in FIGS. 14J and 14K, an oxide film ($SiO_2$ film) is formed on the gate electrode based upon a low-temperature oxidation method, a thin $SiO_2$ film is removed from the silicon substrate (well region), an $SiO_2$ film is formed again on the substrate, and $Si_3N_4$ film is formed on the $SiO_2$ film to locally form gate electrodes of polycrystalline silicon, the surface of the polycrystalline silicon gate is oxidized using the $Si_3N_4$ film as a mask to form an oxide film ($SiO_2$ film), and the $Si_3N_4$ film is removed using the oxide film as a mask thereby to form an MNOS (metal-nitride-oxide-semiconductor) structure as illustrated in FIG. 14M. Therefore, since the MNOS structure is formed after the MOS structure has been formed, characteristics of the MNOS FET's are degraded to a lesser extent. Further, since the gate portions of the MOS FET or MNOS FET are covered with an oxide film by the selective oxidation method, the resulting device exhibits preferred characteristics with regard to withstand voltage between the layers or capacitance among the layers. The aforementioned method also constitutes a major feature of the present invention.

Figure 17:
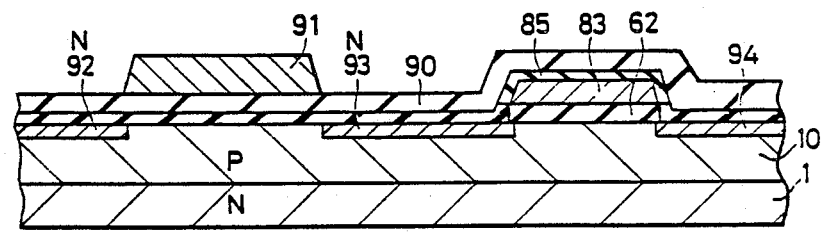
FIGS. 17, 20, 21 to 23 are cross-sectional views illustrating the steps for manufacturing major portions of the semiconductor device.
Figure 18:
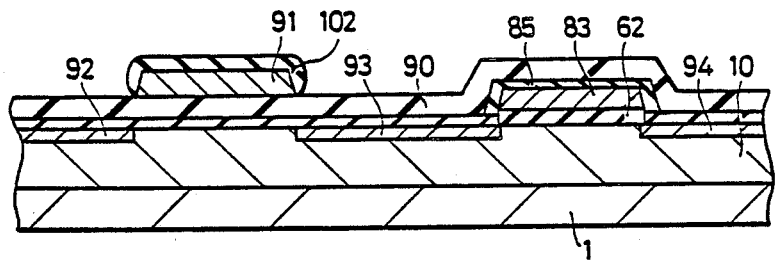
Figure 19:
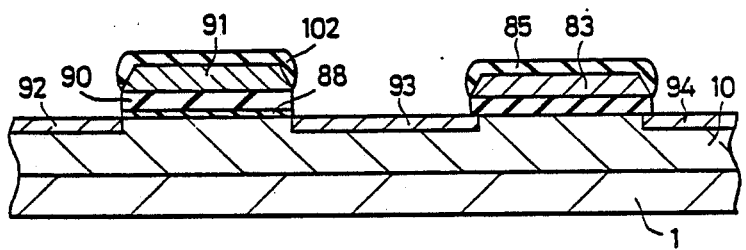
Figure 20:
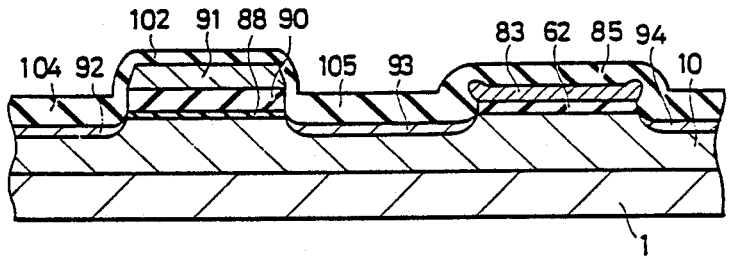

The MOS FET's and MNOS FET's are formed as mentioned above. FIGS. 17 to 20 illustrate on an enlarged scale the cross sections of the MNOS FET forming portion and the MOS FET forming portion which are corresponding to FIGS. 14L and 14M. With reference to FIG. 17, a polycrystalline silicon layer 91 is locally formed on a $Si_3N_4$ film 90 which is formed on an $SiO_2$ film 88 of a thickness of as small as 10 nm, and impurities for forming the source and drain are introduced into the surface of the substrate using the polycrystalline silicon layer 91 as a mask. Then, with reference to FIG. 18, the surface of the polycrystalline silicon layer 91 is oxidized utilizing the $Si_3N_4$ film 90 as a mask, and a relatively thick oxide film ($SiO_2$ film) 102 is formed on the surface of the polycrystalline silicon layer 91. Referring to FIG. 19, portions of the $Si_3N_4$ film 90 are removed by etching with the oxide film 102 as a mask. In this case, the thin $SiO_2$ film 88 is also removed from the surface of the substrate. With reference to FIG. 20, oxide films ($SiO_2$ films) 104, 105 are formed on the surfaces of the source and drain regions which are exposed by the heat treatment in an oxidizing atmosphere. Depending upon the combinations of a gate electrode material and an etching solution (or gas) for treating the $Si_3N_4$ film, the gate electrode may often be subjected to the etching. According to the present invention as mentioned above, however, the gate electrode is patterned, the surfaces of the oxidized gate electrode is covered with an oxide film using the $Si_3N_4$ film as a mask, and the $Si_3N_4$ film is subjected to the etching using the above oxide film as a mask. Therefore, the gate electrode material is not subjected to the etching by the etching solution for treating the $Si_3N_4$ film, so that it is allowed to protect fine gate electrodes. With reference to FIG. 20, furthermore, the $Si_3N_4$ film 90 is completely covered by the $SiO_2$ film 102 formed on the polycrystalline silicon layer 91 and by the $SiO_2$ films 104, 105 formed on the surface of the silicon substrate (well region) 10. Through the above-mentioned sufficient oxidation treatment, therefore, it is allowed to form the construction of a so-called protected gate in a self-aligned manner, presenting such advantages as increased gate insulation voltage of the MNOS FET's and the decreased parasitic capacitance.

Furthermore, as will be understood from FIGS. 17 to 20, two transistors, i.e., MNOS FET and MOS FET are formed on the same semiconductor substrate, and the $Si_3N_4$ film 90 is left only beneath the gate electrode of the MNOS FET. Therefore, the oxidation treatment which is effected to increase the gate insulation voltage of the MNOS FET, causes end portions of the gate electrode of the MOS FET to be oxidized, so that an inverted pent roof construction is formed to enhance the gate insulation voltage of the MOS FET. Accordingly, the gate insulation voltages of the two types of transistors can be increased.

(N) After the step of FIG. 14M has been finished, the $SiO_2$ film is selectively removed by photoetching from the portions where the electric connection must be made with respect to the $n^+$-type layer or to the polycrystalline silicon layer, as shown in FIG. 14N. That is to say, the $SiO_2$ film must be selectively removed by etching from portions 106, 109 and 112 which must be electrically connected to the $n^+$-type layer, and from portions 110 and 111 which must be electrically contacted to the p-type well 11. Consequently, holes 114 to 118 are formed in the $SiO_2$ film. In this case, the $SiO_2$ film is removed by a thickness of about 0.3 $\mu$m by the etching; the $SiO_2$ film 60 which contacts to the p-type well is only partly removed by the etching, and there remains the $SiO_2$ film of a thickness of about 0.3 $\mu$m.

Therefore, the SiO$_2$ film other than the SiO$_2$ film other than the SiO$_2$ film 60 is covered with a photoresist film, so that the SiO$_2$ film 60 is removed by the etching. The holes are so formed in the photoresist film that they are located inside the holes that are formed in the phosphorus glass film.

(O) After the photoresist film used in the above-mentioned step has been removed, a photosilicate glass film 120 (hereinafter referred to as phosphorus glass film) of a P$_2$O$_5$ concentration of about 1 mole % is deposited on the substrate by the CVD method as illustrated in FIG. 14O, followed by the heat treatment at 900° C. for 20 minutes in a hydrogen atmosphere, so that the phosphorus glass film is densely formed and the characteristics of the MNOS FET's are improved.

Thereafter, the phosphorus glass film is removed by photoetching from the regions which must be electrically connected to the n$^+$-layer, the polycrystalline silicon layer and to the p-type well layer. In this case, holes 114 to 118 formed in the SiO$_2$ film and holes formed in the phosphorus glass film have been so adjusted that they will commonly share at least portions of the regions, so that the surface of the silicon substrate or the surface of the polycrystalline silicon layer is allowed to be exposed.

Here, when the holes are formed through one step in the double layer consisting of the phosphorus glass layer and the SiO$_2$ film, the size of the holes tends to become great since the etching rate is faster for the phosphorus glass than for the SiO$_2$, and the adhesiveness is decreased between the photoresist and the phosphorus glass.

Figure 21:
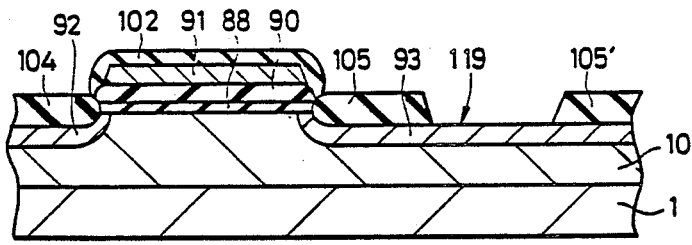

As will be understood from the above description with reference to FIGS. 14N and 14O, however, the embodiment of the present invention is free from such problems. This fact will become more apparent from the following description with reference to FIGS. 21 to 23. Namely, with reference to FIG. 21, holes 119 are formed in the SiO$_2$ film 105 on the surface of the substrate using a mask for contact (not shown).

Figure 22:
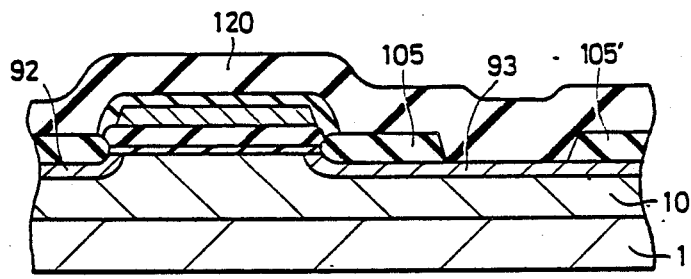
Figure 23:
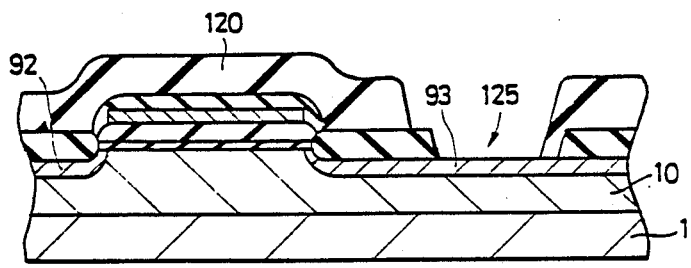

Then, a phosphorus glass film 120 is deposited on the surface of the substrate as shown in FIG. 22. Thereafter, with reference to FIG. 23, holes 125 are formed in the phosphorus glass film 120 in a manner to commonly share a portion of the holes 119 for electric contact. Thus, the holes are precisely formed as designed. Although FIG. 23 illustrates the holes 125 formed in the phosphorus glass film in a manner which is slightly deviated from the holes 119 formed in the SiO$_2$ film 105, it is desirable to so form the holes 125 in the phosphorus glass film that the entire areas of the holes 119 in the SiO$_2$ film are exposed, and more desirably, that the edge portions of the SiO$_2$ films are exposed, so that metal wirings such as of aluminum are not disconnected.

(P) After the photoresist is removed, an aluminum film is formed to a thickness of about 0.8 μm on the entire surfaces at a temperature of about 300° C.

Then, a wiring pattern is formed in the aluminum film by the photoetching method as shown in FIG. 14O, thereby to form aluminum electrodes or wiring portions 121, 122, 123 and 124. After the photoresist is removed, the heat treatment is effected in a hydrogen atmosphere at about 450° C. for 60 minutes, in order to reliably attain electric contact between the aluminum film and the n$^+$-type layer, polycrystalline silicon layer or the p-type well, as well as to reduce the surface level.

Through the steps (A) to (P) mentioned in detail in the foregoing, it is allowed to form in and on the surface of a piece of a semiconductor substrate 1, MOSFET's having the gate electrode 91, enhancement-type MOSFET's (transistors which correspond to the aforementioned switching MISFET's) having the gate electrode 83, depression-type MOSFET's having the gate electrode 84, and npn-type bipolar transistors consisting of semiconductor regions 97, 11 and 1 without needing additional photomasks, as shown in FIG. 14O. In the drawings, reference numeral 121 denotes a source or a drain electrode of the enhancement-type MISFET, 122 denote an emitter electrode of the bipolar transistor, 123 denotes a base of the bipolar transistor and the electrode of the p-type well region 11, and 124 denotes electrodes of the region 22 and of the substrate.

Below is illustrated the wiring pattern of the memory array.

Figure 24:
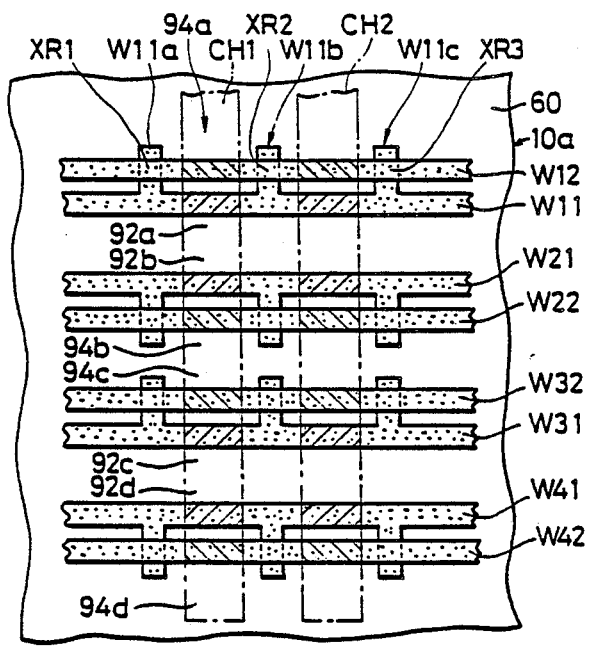
FIG. 24 is a plan view illustrating a memory array before a layer of phosphorus glass is formed.
Figure 25:
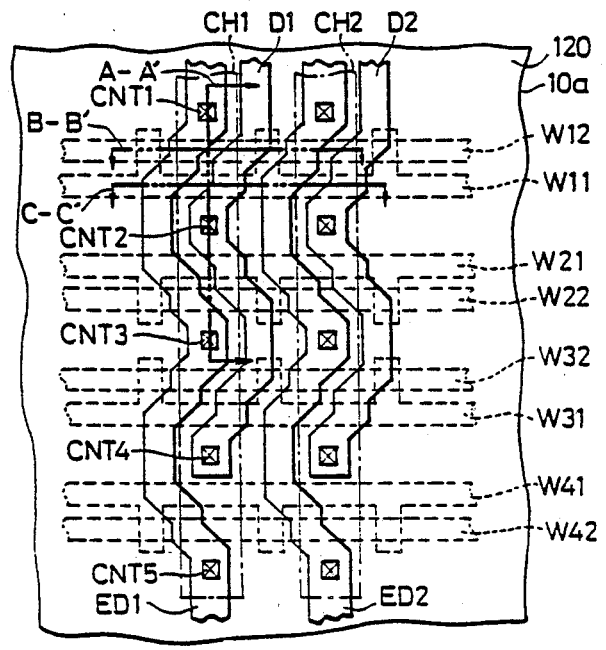
FIG. 25 is a plan view of the memory array after a wiring layer of aluminum is formed.
Figure 26:
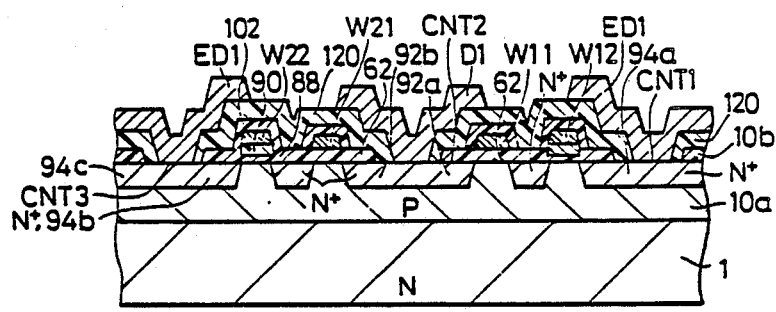
FIGS. 26, 27 and 28 are cross-sectional views along the lines A—A', B—B' and C—C' of FIG. 25.
Figure 27:
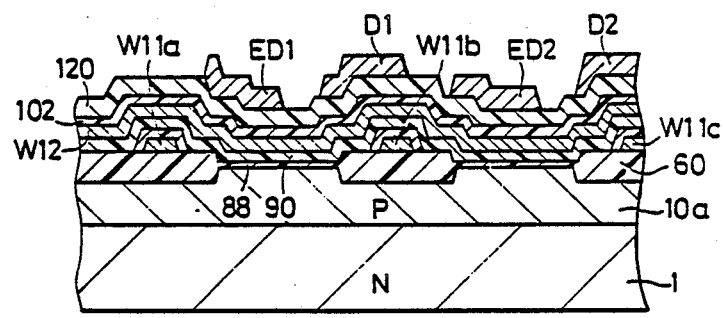
Figure 28:
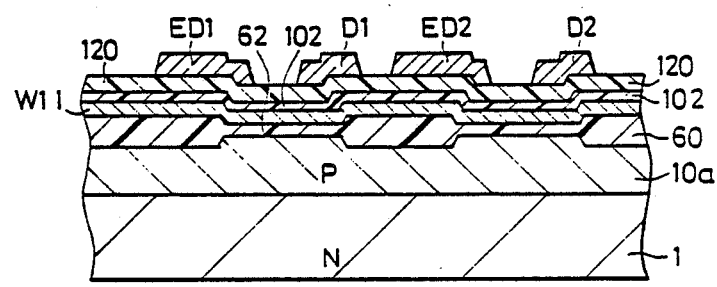

FIG. 24 is a plan view of the memory array before the phosphorus glass layer is formed, and FIG. 25 is a plan view of the memory array after the aluminum wiring is formed. FIGS. 26, 27 and 28 are cross-sectional views along the line A—A', along the line B—B' and along the line C—C' of FIG. 24.

As shown in FIGS. 26 to 28, the memory array is formed on a p-type well region 10a which is formed on the n-type silicon substrate 1.

Referring to FIG. 24, the source regions, drain regions and channel regions of the MNOSFET's and switching MISFET's in the memory cell have been indicated by dot-dash lines. A thick silicon oxide film 60 is formed on the surface of the p-type well region 10a except the sections CH1 and CH2 which are surrounded by a dot-dash line.

On the surface of the p-type well region 10a have been formed a plurality of polycrystalline silicon layers W11, W21, W31 and W41 which serve as gate electrodes and first word lines of the switching MISFET's in the memory cell, via the silicon oxide film and in a direction to cross the sections CH1 and CH2.

Similarly, there have also been formed a plurality of polycrystalline silicon layers W12, W22, W32 and W42 which serve as gate electrodes and second word lines of MNOS FET's in the memory cell.

N-type impurities are introduced into the surfaces of the p-type well region 10a in the sections CH1 and CH2 which are not covered with the polycrystalline silicon layer, by a method as illustrated with reference to FIG. 14, thereby to form n$^+$-type regions that serve as source regions and drain regions of the MNOS FET's and switching MISFET's.

The n$^+$-type region 92a, the polycrystalline silicon layers W11 and W12, and the n$^+$-type region 94a constitute a first memory cell in the section CH1. Namely, the n$^+$-type region 92a constitutes a drain region for the switching MISFET, and the polycrystalline silicon layer W11 constitutes a gate electrode therefor. Further, the polycrystalline silicon layer W12 constitutes a gate electrode for the MNOS FET, and the n$^+$-type region 94a constitutes a source region therefor. The n$^+$-type region 92b adjacent to the first memory cell, the polycrystalline silicon layers W21 and W22, and the n$^+$-type region 94b constitute a second memory cell in the section CH1. Namely, the region 92b, the layers W21 and W22 and the region 94b constitute a drain region and a gate electrode for the switching MISFET, as well as a gate electrode and a source region for the MNOSFET.

Similarly, the region 94c, the layers W32, W31 and the region 92c constitute a third memory cell, and the region 92d, the layers W41 and W42, and the region 94d constitute a fourth memory cell in the section CH1. Though not indicated by reference numerals, the first to fourth memory cells have also been formed in the neighbouring section CH1.

The memory cells formed in the section CH1 constitute a first memory cell column, and the memory cells formed in the section CH2 constitute a second memory cell column.

Figure 15:
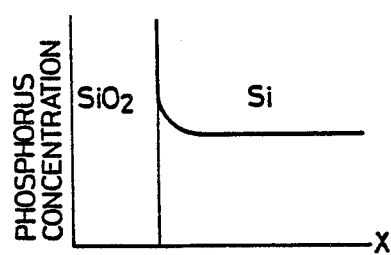
FIGS. 15 and 16 are diagrams illustrating distributions of phosphorus atoms and boron atoms which are impurities in the Si—SiO$_2$ interface.
Figure 16:
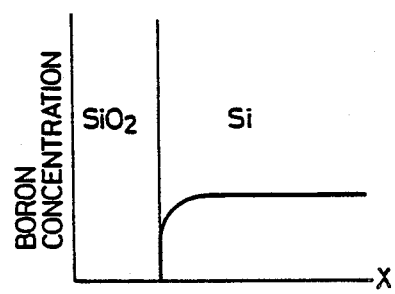

The polycrystalline silicon layer W11 which serves as the first word line has extending portions W11a to W11c which extend beneath the polycrystalline silicon layer W12 on the thick silicon oxide film 60 as illustrated in FIG. 15.

The polycrystalline silicon layer W12 which constitutes the second word line, receives a high voltage of +25 [V] when information is being written down. Therefore, a parasitic channel is often induced on the surface of the p-type well region 10a beneath the polycrystalline silicon layer W12. The polycrystalline silicon layer W11 constitutes the first word line and receives signals of a low voltage of +5 [V] as mentioned earlier. Therefore, the parasitic channel induced on the surface of the p-type well region 10a beneath the polycrystalline silicon layer W12 is interrupted by the extending portions W11a to W11c of the polycrystalline silicon layer W11.

Therefore, it is possible to prevent such an undesirable operation that the memory cells in the sections CH1 and CH2 are electrically coupled together by the parasitic channel, so that information is not written down in a selected memory cell.

A phosphorus glass layer 120 is then formed on the surface of the memory array of FIG. 24 by the method illustrated with reference to FIG. 14. Then, the phosphorus glass layer 120 and the oxide film lying beneath thereof are selectively removed to form holes CNT1 to CNT5 (refer to FIG. 25) such that the n+-type region is allowed to be exposed.

Then, aluminum is deposited by vaporization and is subjected to the selective etching, to form aluminum wiring layers ED1, ED2, D1 and D2 as shown in FIG. 25.

Through the holes CNT1, CNT3 and CNT5, the wiring layer ED1 is allowed to come into contact with the n+-type regions 94a, 94b, 94c and 94d (refer to FIG. 24) which serve as source regions of MNOSFET's in the first to fourth memory cells. Therefore, the wiring layer ED1 constitutes a reference potential line in the memory array.

The wiring layer D1 through the holes CNT2 and CNT4 comes into contact with the n+-type regions 92a, 92b, 92c and 92d which serve as drain regions of switching MISFET's in the first to fourth memory cells. Therefore, the wiring D1 constitutes a digit line in the memory array.

Similarly, the wiring layers ED2 and D2 constitute another reference potential line and another digit line, respectively.

According to the above-mentioned memory array as shown in FIG. 24, the MNOSFET's and the switching MISFET's in the memory cells in the same memory column are arrayed being reversed alternately. Therefore, the n+-type regions of the neighbouring memory cells can be commonly utilized as denoted, for example, by 92a and 92b, and by 94b and 94c, such that the size in the direction of column can be reduced as compared with the case when the n+-type regions are independently formed for each of the memory cells.

Referring to FIG. 25, furthermore, the aluminum wiring layers ED1, ED2, D1 and D2 are formed on the belt-like sections CH1 and CH2 which form memory cells, being tilted with respect to the direction in which the sections CH1 and CH2 stretch. The aluminum wiring layers are then alternately connected to the n+-type regions, so that the size in the lateral direction of the paper is reduced as compared with the case when the wiring regions are independently formed for each of the sections.

Further, since the aluminum wiring layers are used as reference potential lines and digit lines instead of using of using semiconductors such as n+-type semiconductor wiring regions, the resistance can be sufficiently reduced. The reduction in the resistance of the wiring enables the memory array to operate at high speeds.

The wiring pattern of the X decoder is illustrated below.

Figure 29:
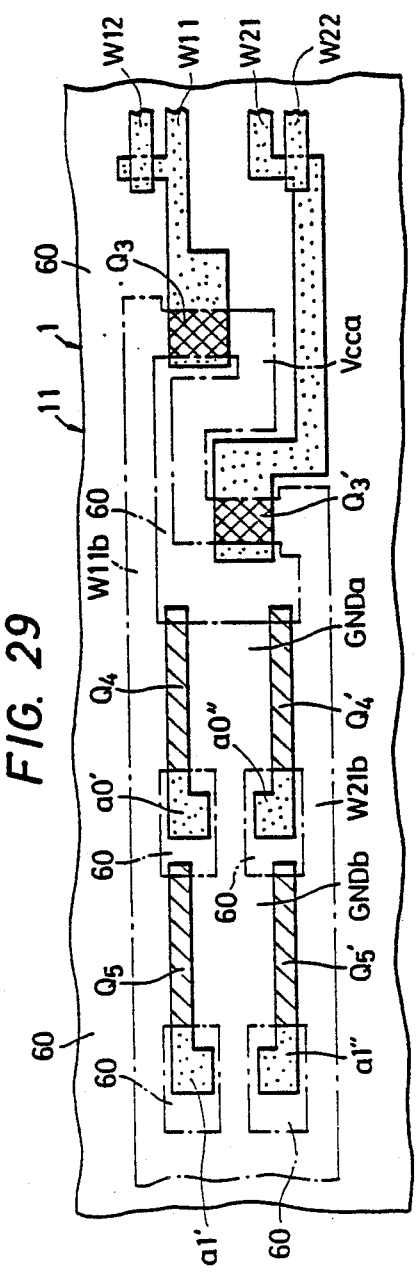
FIG. 29 is a plan view of an X decoder before a layer of phosphorus glass is formed.
Figure 30:
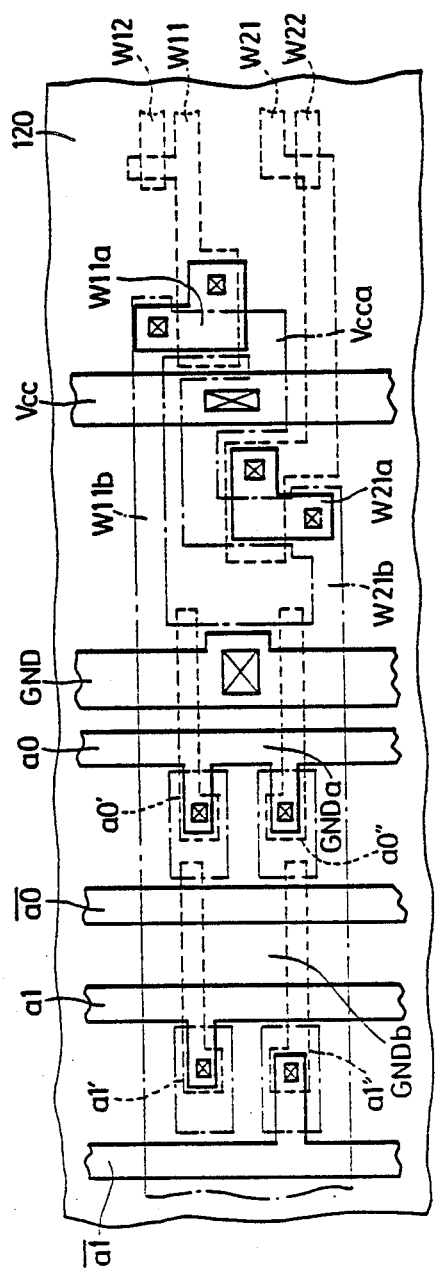
FIG. 30 is a plan view of the X decoder after a wiring layer of aluminum is formed.

FIG. 29 illustrates a pattern of an X decoder before the phosphorus glass layer is formed, and FIG. 30 illustrates a pattern after aluminum wiring layers are formed on the portions corresponding to the pattern of FIG. 29.

The individual X decoders have been provided for each of the memory cells in the memory array, and have been so designed that the pitch among the memory cells is not increased. Therefore, although not specifically restricted, the combination of two X decoders substantially serve as one unit as will be illustrated below with reference to FIGS. 29 and 30.

With reference to FIG. 29, the X decoder is formed on the p-type well region 11 which is formed on the n-type silicon substrate 1. Regions for forming the MISFET's are surrounded by a dot-dash line in FIG. 29. The thick silicon oxide film 60 has been formed on the surface of the p-type well region 11 except the above-mentioned regions.

Polycrystalline silicon layers W11, W21, a0', a0'', a1' and a1'' of a first layer of a pattern as indicated by the combination of dots and solid lines, have been formed on the silicon oxide film 60 and on the gate oxide film of the regions surrounded by the dot-dash line. The n+-type regions are formed by the method illustrated with reference to FIG. 14 in the regions except those beneath the polycrystalline silicon layers among the regions surrounded by the dot-dash line.

In FIG. 29, channel regions for the enhancement-type MISFET's are formed beneath the polycrystalline silicon layers which are indicated by leftwardly tilted hatched lines, and channel regions for the depression-type MOSFET's are formed beneath the polycrystalline silicon layers which are indicated by the combination of leftwardly tilted hatched lines and rightwardly tilted hatched lines.

In the upper half portion in the paper of FIG. 29, the depression-type MISFET Q3 is formed by the n+-type regions VCCa, the polycrystalline silicon layer W11 and the n+-type region W11b, the enhancement-type MISFET Q4 is formed by the n+-type region W11c, the polycrystalline silicon layer a0' and the n+-type region GNDa, and the enhancement-type MISFET Q5 is formed by the n+-type region W11c, the polycrystalline silicon layer a1' and the n+-type region GNDb.

The MISFET's Q3', Q4' and Q5' are similarly constituted in the lower half portion of the paper of FIG. 29.

The phosphorus glass layer 120 is formed on the surface of the decoder of FIG. 29 as shown in FIG. 30, and holes are formed in the phosphorus glass layer and in the underlying oxide film by the selective etching method.

Various aluminum wiring layers are formed as shown in FIG. 30 by the vaporization of aluminum and the selective etching. In FIG. 30, symbol X denotes the holes formed in the insulation films such as phosphorus glass layer and the oxide film. In the portions indicated by the symbol X, therefore, the aluminum wiring layers come into contact with the underlying polycrystalline silicon layers or the semiconductor regions.

Referring to FIG. 30, the wiring layer W11a works as a short-circuiting layer which short-circuits together the polycrystalline silicon layer W11 which serves as the gate electrode of MISFET Q3 (refer to FIG. 29), the source region thereof, and the $n^+$-type region W11b which serves as a common drain region for the MISFET's Q4 and Q5. The wiring layer VCC which is connected to the power supply, is contacted to the $n^+$-type region VCCa which serves as a common drain region for the MISFET's Q3 and Q3' (refer to FIG. 29). The ground layer GND is connected to ground, and is contacted to the $n^+$-type region GNDa which serves as a common source region for the MISFET's Q4 and Q4'. In FIG. 29, the $n^+$-type region GNDb which serves as a common source region for the MISFET's Q5 and Q5' is continuous to the above-mentioned $n^+$-type region GNDa.

Wiring layers a0 and $\overline{a0}$ constitute a pair of wiring layers for receiving address signals of opposite phases. Either one of them which is selected, i.e., the layer a0 in the diagramatized embodiment is contacted to the polycrystalline silicon layer a0' was well as to the polycrystalline silicon layer a0''.

Similarly, the wiring layers a1 and $\overline{a1}$ constitute a pair of wiring layers for receiving other address signals of opposite phases. In the diagramatized embodiment, the wiring layer a1 is contacted to the polycrystalline silicon layer a1', and the wiring layer $\overline{a1}$ is contacted to the polycrystalline silicon layer a1''.

As mentioned above, a decoder such as X decoder XD1 of FIG. 4 is formed in the upper half portion of FIG. 30, and another decoders such as XD2 is formed in the lower half portion of FIG. 30.

The X decoders are arrayed along the column of memory cells. Therefore, the wiring layers VCC, GND, a0, $\overline{a0}$, a1 and $\overline{a1}$ are commonly utilized by the plurality of X decoders.

Below is illustrated the wiring pattern of the writing circuit.

Figure 31B:
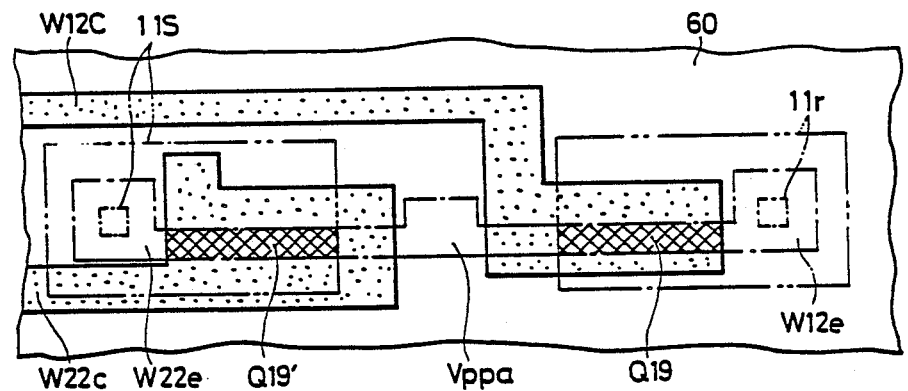
Figure 32B:
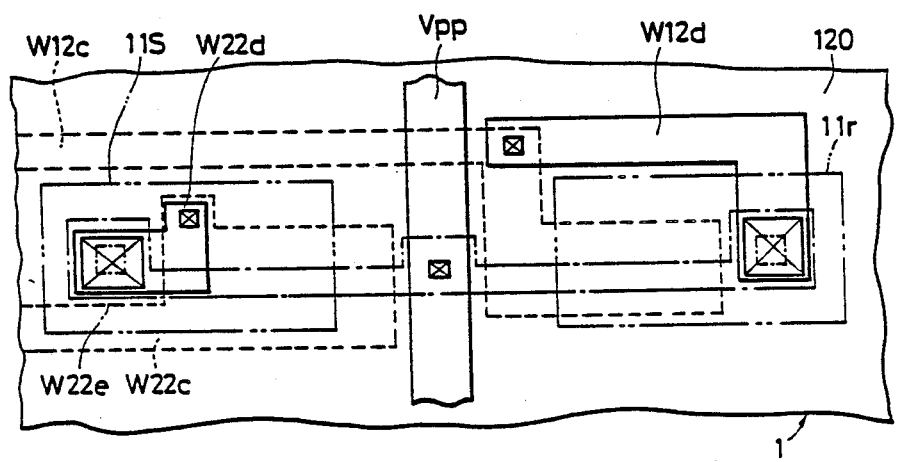

FIGS. 31A and 31B illustrate patterns of the writing circuit before the phosphorus glass layer is formed, and FIGS. 32A and 32B illustrate patterns of the writing circuit after aluminum wiring layers are formed on the portions corresponding to the patterns of FIGS. 31A and 31B. The right end of the patterns of FIG. 31A is connected to the left end of FIG. 31B, and the right end of FIG. 32A is connected to the left end of FIG. 32B.

Patterns of FIGS. 31A, 31B, 32A and 32B are denoted by the same reference numerals as those of FIGS. 29 and 30.

Because of the same reasons as mentioned with regard to the X decoders, two writing circuits substantially serve as a unit writing circuit.

The polycrystalline silicon layers W11 and W21 which serve as first word lines and which are stretched, via the thick silicon oxide film 60, on the p-type well region 10b as indicated by a two-dot-dash line to constitute the memory array, are contacted to the drain regions W11d and W21d of MISFET's Q15 and Q15' which are formed on the p-type well region 11 via aluminum wiring layers W11C and W21C.

To the p-type well region 10b is contacted an aluminum wiring layer e to which will be applied signals from the erasing circuit (refer to FIG. 4).

Signals of the control line We (refer to FIG. 4) are fed to the polycrystalline silicon layer We which serves as gates for the MISFET's Q15 and Q16.

The polycrystalline silicon layers W12 and W22 which serve as second word lines are contacted to a common drain region W12b of MISFET's Q16 and Q17 and to a common drain region W22 of MISFET's Q16' and Q17' which are formed in the p-type well region 11 indicated by a two-dot-dash line via aluminum wiring layers W12a and W22a, and are further contacted to the polycrystalline silicon layers W12c and W22c.

The power supply voltage of +5 [V] is applied to the polycrystalline silicon layer VCC which serves as a common gate for the MISFET's Q16, Q17, Q16' and Q17'.

The aluminum wiring layer GND which assumes the ground potential is contacted to a common drain region GNDa for the MISFET's Q18 and Q18'.

The polycrystalline silicon layer W12c serves as the gate electrode for the MISFET's Q19 which is formed in an independent p-type well region 11r, and is contacted to the source region W12e of the MISFET Q19 and to the p-type well region 11r via the aluminum wiring layer W12d.

Similarly, the polycrystalline silicon layer W22c serves as the gate electrode for the MISFET's Q19' which is formed in another independent p-type well region 11s, and is contacted to the source region W22e of the MISFET's Q19' and to the p-type well regions 11s through the aluminum wiring layer W22d.

The MISFET's Q19 and Q19' have been constructed as illustrated with reference to FIG. 9 or FIG. 11. The aluminum wiring layer VPP to which will be applied a high voltage for writing and erasing information is contacted to the common drain region VPPa for the MISFET's Q19 and Q19' which are stretching on the n-type silicon substrate 1.

The circuit WA1 of FIG. 4 is constituted by the MISFET's Q15 to Q19, and another circuit WA2 is constituted by the MISFET's Q15' to Q19'.

Like the above-mentioned X decoders, the writing circuits of FIGS. 31A, 31B, 32A and 32B are arrayed for each of the memory cells.

The wiring pattern of the Y gate circuit is illustrated below.

FIG. 33 illustrate a pattern of the Y gate circuit before the phosphorus glass layer is formed, and FIG. 34 illustrate a pattern of portions corresponding to the pattern of FIG. 33 after the aluminum writing layer is formed.

An aluminum wiring layer CDa for connecting the gates in parallel, is contacted to the polycrystalline silicon layer CD which serves as a common digit line.

The aluminum wiring layer CDa is contacted to a common drain region CDb for the MISFET's Q11 and Q13. Aluminum wiring layers Y1 and Y2 which receive the outputs of the Y decoders YD1 and YD2 (refer to FIG. 4) are contacted to the polycrystalline silicon layers Y1a and Y2a which serve as gate electrodes for the MISFET's Q11 and Q13.

The source region of the MISFET's Q11 and the drain region of the MISFET's Q12 form a common n+-type region D1b, and the source region of the MISFET's Q13 and the drain region of the MISFET Q14 form a common n+-type region.

The power supply voltage of +5 [V] is applied to the polycrystalline silicon layer VCC which serves as gate electrodes for the MISFET's Q12 and Q14.

To the source region D1a of the MISFET Q12 is contacted the aluminum wiring layer D1 which serves as a digit line, and to the source region D2a of the MISFET Q14 is contacted an aluminum wiring layer which serves as another digit line.

Figure 35A:
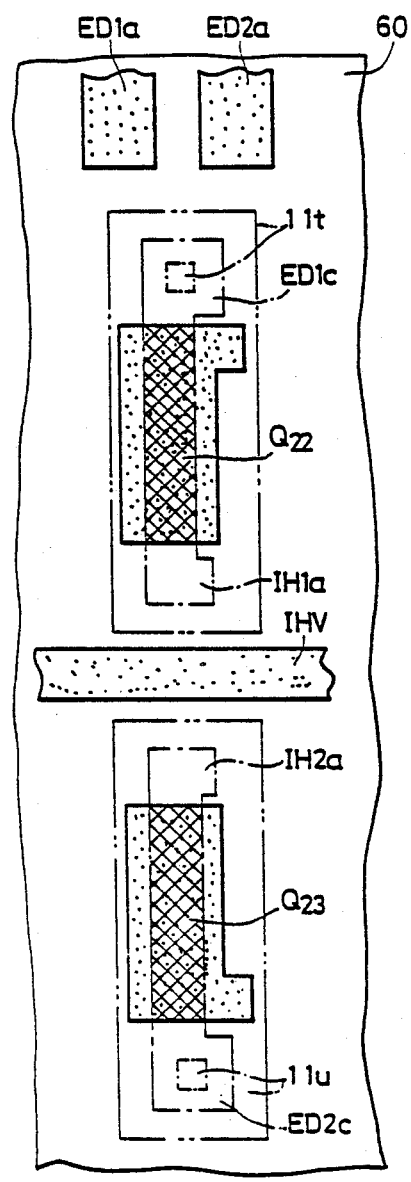
FIGS. 35A and 35B are plan views of a writing inhibit circuit before the layer of phosphorus glass is formed.
Figure 36A:
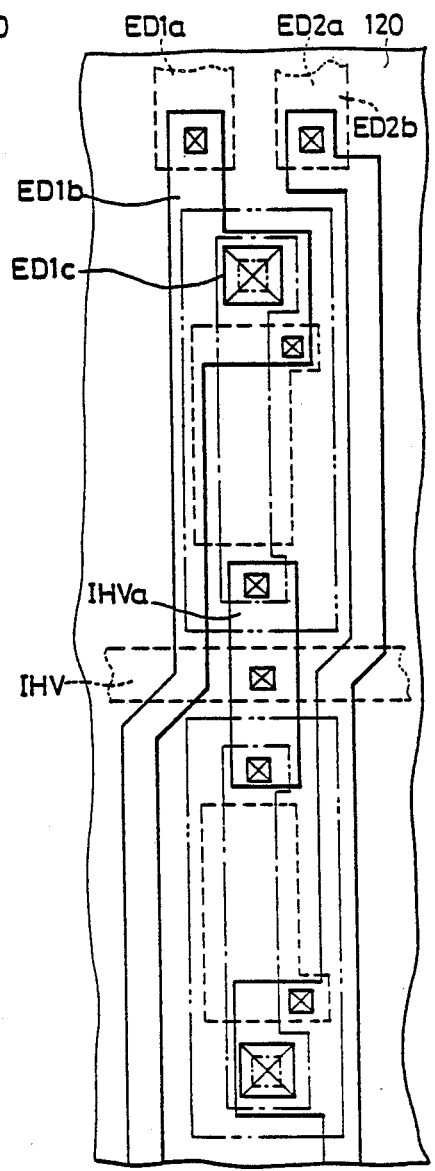
FIGS. 36A and 36B are plan views of the writing inhibit circuit after the wiring layer of aluminum is formed.
Figure 35B:
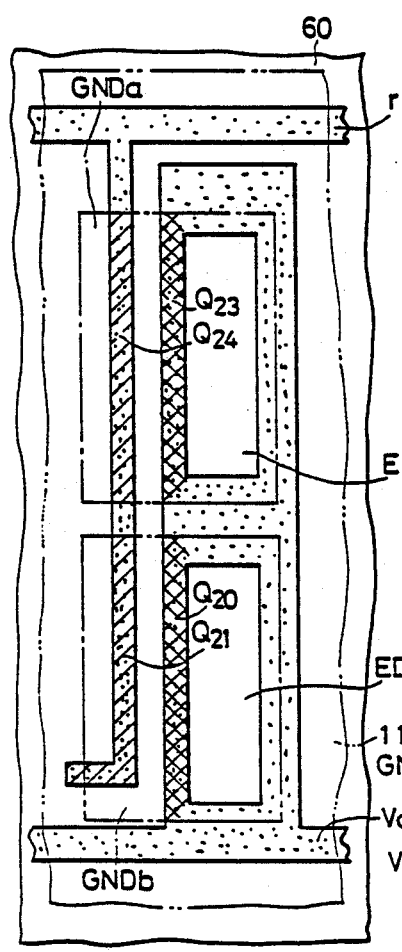
Figure 36B:
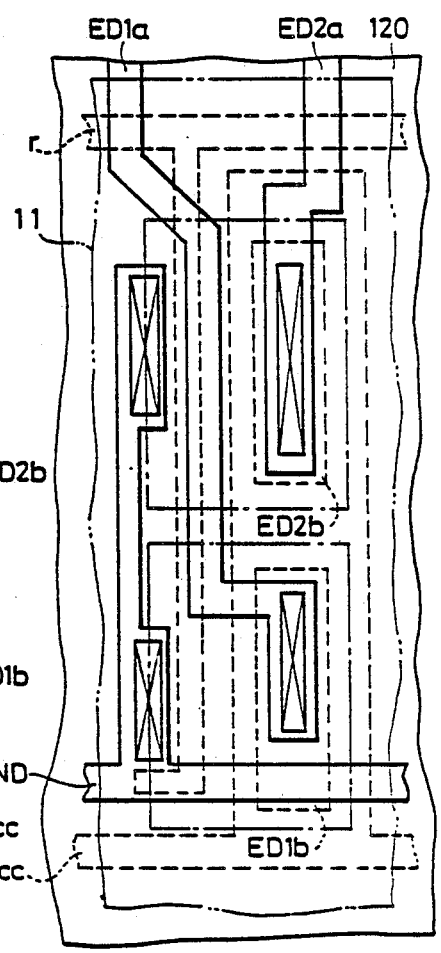

FIGS. 35A and 35B illustrate a pattern of the writing inhibit circuit before the phosphorus glass layer is formed, and FIGS. 36A and 36B illustrate a pattern of the portions corresponding to the pattern of FIGS. 35A and 35B after the aluminum wiring layer is formed. The lower end of FIG. 35A is connected to the upper end of FIG. 35B, and the lower end of FIG. 36A is connected to the upper end of FIG. 36B.

Like FIG. 9, a wiring region WIR is arrayed between the memory array and the writing inhibit circuit. Therefore, although not specifically limited, the aluminum wiring layers ED1 and ED2 which serve as reference potential lines as illustrated with reference to FIGS. 24 and 26, are respectively contacted to the polycrystalline silicon layers ED1a and ED2a which are formed simultaneously with the polycrystalline silicon layers of the MISFET's. In the wiring region WIR, a variety of aluminum wiring layers are formed on the polycrystalline silicon layers ED1a and ED2a via the oxide film and the phosphorus glass layer.

FIGS. 35A, 35B, 36A and 36B employ the same reference numerals as those of the preceding diagrams. Therefore, the construction of the writing inhibit circuit diagramatized in FIGS. 35A, 35B, 36A and 36B is not illustrated here.

According to the present invention, the decoders and writing circuits are arrayed with the square memory array interposed therebetween. In other words, the decoders are arrayed along a side of the memory array and writing circuits are arrayed along another side thereof. Therefore, the operation speed can be increased and, particularly, the reading speed can be increased. On the other hand, if the decoders and writing circuits are arrayed on one side of the memory array, long wirings will be necessary to connect the decoders to the memory cells. Furthermore, since a plurality of circuits must be arrayed on one side of the memory array, wirings will have to be crossed at many places as customarily done in the semiconductor integrated circuits. Consequently, wirings for feeding signals to the memory array exhibit diminished signal transmission characteristics so that a serious limitation if imposed on the operation speed.

When the decoders and writing circuits are arrayed on both sides of the memory arrays, pitches between the individual decoders and the individual writing circuits can be relatively decreased and the size of the memory array is not restricted by these circuits.

Further, since gates or decoders and writing inhibit circuits are arrayed with the memory array being interposed therebetween, the device is allowed to operate at high speeds because of the same reasons as mentioned above.

The construction in which the decoders and writing circuits are arrayed with the memory array being interposed therebetween, or the construction in which the gates or decoders and writing circuits are arrayed with the memory array being interposed therebetween, can be applied to memory devices of any other types which employ writing circuits or writing inhibit circuits.

According to the present invention, it is allowed to employ well regions to effectively form the circuits of high withstand voltage.

With reference to the voltage divider circuit of FIG. 4 in which the enhancement-type MISFET's Q37 to Q39 are connected in series, the greatest voltage is applied to the drain of the MISFET Q37. Therefore, if the MISFET Q37 is destroyed by the high voltage, the MISFET Q38 is also subjected to the high voltage via the destroyed MISFET Q37. Consequently, the MISFET's which are connected in series are successively destroyed. According to the present invention, however, the MISFET Q37 which is subject to the greatest voltage is constructed by utilizing the well region to exhibit high withstand voltage. Therefore, the above-mentioned destruction can be prevented even if other MISFET's Q38 to Q39 are ordinarily constructed. The aforementioned voltage divider circuit can be used for other circuit devices than the memory circuit device of the embodiment of the present invention.

Likewise, the erasing circuit and writing inhibit voltage generator of FIG. 4 can also be used for other applications.

As mentioned above, the semiconductor memory circuit device of the present invention can be used as a part for large computers and industrial robots.

What is claimed is:

1. A method of manufacturing integrated circuit devices, comprising:
   selectively oxidizing a semiconductor substrate so as to form oxide films on a plurality of well regions formed in the semiconductor substrate, said plurality of well regions each extending to a major surface of said semiconductor substrate, said well regions being spaced from each other and each being a continuous semiconductor region, said semiconductor substrate being of a first or second conductivity type, the second conductivity type being opposite that of the first, and said plurality of well regions being of a second conductivity type; and
   introducing impurities of the first conductivity type into the substrate using said oxide film as a mask to thereby introduce said impurities into the substrate among the well regions, whereby said impurities are introduced as a layer among the well regions in a self-aligned manner.

2. A method of manufacturing integrated circuit devices according to claim 1, wherein said impurities are introduced by ion implantation, and wherein said oxide film is sufficiently thick to prevent introduction of said impurities into the substrate through said oxide film.

3. A method of manufacturing integrated circuit devices according to claim 1, wherein said oxide film is a silicon oxide film.

4. A method of manufacturing integrated circuit devices according to claim 1, wherein said impurities are introduced in a sufficient concentration such that the impurity layer is a channel stopper between adjacent well regions.

5. A method of manufacturing integrated circuit devices according to claim 1, wherein, after introducing the impurities of the first conductivity, the oxide film is removed, to thereby provide the semiconductor substrate with a stepped portion, at the surface of the substrate, at the boundary among the well regions and the remainder of the semiconductor substrate.

6. A method of manufacturing integrated circuit devices according to claim 1, wherein the impurities of the first conductivity type are introduced into the substrate so as to form semiconductor regions of the first conductivity type, of greater impurity concentration than that of the substrate, among the wells.

7. A method of manufacturing semiconductor devices according to claim 1, comprising the further steps, prior to said selectively forming oxide films, of:
  selectively forming an anti-oxidation film on portions of the surface of said semiconductor substrate, where said oxide films are not to be formed, leaving other portions of the surface of the semiconductor substrate, on which said oxide films are to be formed, exposed; and
  introducing impurities for forming said well regions into the exposed portions of the surface of the semiconductor substrate;
  and wherein said well regions are formed, after said introducing said impurities, by oxidizing the surface of said substrate by using said anti-oxidation films as a mask, said oxide films being thereby selectively formed.

8. A method of manufacturing semiconductor devices according to claim 1, wherein said well regions are semiconductor regions in which semiconductor elements can be formed.

9. A method of manufacturing semiconductor devices, comprising:
  introducing impurities of a second conductivity type into a semiconductor substrate of a first or second conductivity type, using an anti-oxidation film locally formed on the semiconductor substrate as a mask, so as to form a plurality of well regions of the second conductivity type in the semiconductor substrate of a first or second conductivity type, the second conductivity type being opposite that of the first conductivity type, whereby said plurality of well regions are formed in a self-aligned manner with the anti-oxidation film locally formed on said semiconductor substrate, said plurality of well regions each being a continuous semiconductor region;
  oxidizing the semiconductor substrate so as to form an oxide film on said plurality of well regions, using said anti-oxidation film as a mask therefor; and
  removing said anti-oxidation film, and introducing impurities into the surface of said substrate among said well regions using said oxide film as a mask, whereby the impurities are introduced among the wells in a self-aligned manner.

10. A method of manufacturing semiconductor devices according to claim 9, wherein the impurities introduced into the surface of the substrate among the well regions are impurities that impart the first conductivity type to the substrate.

11. A method of manufacturing semiconductor devices according to claim 9, wherein each well region that is a continuous region is a well region in which a semiconductor element can be formed.

12. A method of manufacturing semiconductor devices comprising:
  locally forming an anti-oxidation film on a main surface of a semiconductor substrate of a first or second type of conductivity, the second type of conductivity being opposite that of the first conductivity type;
  introducing impurities which impart the second type of conductivity into the surface of said substrate in the portions which are not covered by said anti-oxidation film, in order to form at least one semiconductor region;
  oxidizing the surface of said substrate, using said anti-oxidation film as a mask, so as to form an oxide film;
  removing said anti-oxidation film, and introducing impurities which impart the first type of conductivity into the surface of said substrate at least one portion thereof not including said at least one semiconductor region using said oxide film as a mask, whereby the impurities are introduced relative to the at least one semiconductor region in a self-aligned manner; and
  forming insulated gate field effect transistors in said semiconductor regions, the forming of the transistors including providing gate electrodes on said semiconductor regions, and providing source or drain regions of said first type of conductivity in said at least one semiconductor region at the sides of said gate electrodes.

13. A method of manufacturing semiconductor devices according to claim 12, wherein a plurality of semiconductor regions are formed using said anti-oxidation film as a mask and impurities are introduced into the surface of said substrate at least one portion thereof not including said plurality of semiconductor regions using said oxide film as a mask, whereby the impurities are introduced relative to the plurality of semiconductor regions in a self-aligned manner.

14. A method of manufacturing semiconductor devices according to claim 12, wherein the impurities introduced into the surface of the substrate using said oxide film as a mask are impurities which impart the first type of conductivity.

15. A method of manufacturing semiconductor devices comprising:
  locally forming an anti-oxidation film on a main surface of a semiconductor material;
  introducing impurities into the surface of said semiconductor material in the part of the material which is not covered by said anti-oxidation film, in order to form at least one semiconductor region;
  oxidizing the surface of said material so as to form an oxide film, using said anti-oxidation film as a mask;
  removing said anti-oxidation film, and introducing impurities into the surface of said semiconductor material over which the anti-oxidation film has been removed using said oxide film as a mask, whereby the impurities are introduced into the surface of said semiconductor material in a self-aligned manner; and
  forming insulated gate field effect transistors in said at least one semiconductor region, the forming of the transistors including providing gate electrodes on said at least one semiconductor region, and providing source or drain regions in said at least one semiconductor region at the side of said gate electrodes.

16. A method of manufacturing semiconductor devices according to claim 15, wherein the impurities introduced into the surface of said material in the part of the material which is not covered by said anti-oxidation film are impurities which impart a second type of conductivity to the material; wherein the impurities introduced into the surface of the material over which the anti-oxidation film has been removed are impurities which impart a first type of conductivity to the material, said first type of conductivity being opposite to that of the second type of conductivity; and wherein said insulated gate field effect transistors are MISFETs, the source or drain regions being source or drain regions of said MISFETs.

17. A method of manufacturing semiconductor devices according to claim 16, wherein the impurities to impart a second type of conductivity introduced into the surface of the material in the part of the material which is not covered by said anti-oxidation film are introduced into substantially the entire area of the surface of the material not covered by said anti-oxidation film.

18. A method of manufacturing semiconductor devices according to claim 15, wherein the impurities introduced into the surface of said material in the part of the material which is not covered by said anti-oxidation film are introduced into substantially the entire uncovered area of the surface of said material.

19. A method of manufacturing semiconductor devices according to claim 15, wherein the impurities introduced into the surface of said material in the part of the material which is not covered by said anti-oxidation film, and the impurities introduced into the surface of said material over which the anti-oxidation film has been removed, are impurities which impart opposite conductivity types to the semiconductor material.

20. A method of manufacturing semiconductor devices according to claim 19, wherein the semiconductor material is of one conductivity type, said one conductivity type being the same as that of the at least one semiconductor region or a semiconductor region formed from introducing impurities into the surface of the material over which the anti-oxidation film has been removed, the impurity concentration of the region of the same conductivity type as that of the semiconductor material being greater than that of the semiconductor material.

21. A method of manufacturing semiconductor devices according to claim 15, wherein said anti-oxidation film is comprised of a silicon nitride film.

22. A method of manufacturing semiconductor devices according to claim 21, wherein said impurities introduced into the surface of the semiconductor material over which the anti-oxidation film has been removed are impurities to impart to the semiconductor material a conductivity type the same as that of the semiconductor material.

23. A method of manufacturing semiconductor devices according to claim 22, which further comprises:
locally forming a further anti-oxidation film on the surface of the semiconductor material after said introducing impurities into the surface of said material over which the anti-oxidation film has been removed;
then locally forming a field oxide film by locally oxidizing the surface of said material where the transistors are not to be formed, using said further anti-oxidation film as a mask; and
forming a gate oxide film, for an insulated gate field effect transistor, on at least one of said at least one semiconductor region.

24. A method of manufacturing semiconductor devices according to claim 23, wherein said impurities introduced into the surface of the material over which the anti-oxidation film has been removed are introduced so as to form at least one semiconductor region, of the same conductivity type as that of said semiconductor material, having a higher impurity concentration than that of said semiconductor material.

25. A method of manufacturing semiconductor devices according to claim 22, wherein said impurities introduced into the surface of the material over which the anti-oxidation film has been removed are introduced so as to form at least one semiconductor region, of the same conductivity type as that of said semiconductor material, having a higher impurity concentration than that of said semiconductor material.

26. A method of manufacturing semiconductor devices according to claim 15, wherein said impurities introduced into the surface of the material over which the anti-oxidation film has been removed are introduced so as to form at least one semiconductor region, of the same conductivity type as that of said semiconductor material, having a higher impurity concentration than that of said semiconductor material.

27. A method of manufacturing semiconductor devices according to claim 15, which further comprises:
locally forming a further anti-oxidation film on the surface of the semiconductor material after said introducing impurities into the surface of said material over which the anti-oxidation has been removed;
then locally forming a field oxide film by locally oxidizing the surface of said substrate where the transistors are not to be formed, using said further anti-oxidation film as a mask; and
forming a gate oxide film, for an insulated gate filed effect transistor, on at least one of said at least one semiconductor region.

28. A method of manufacturing semiconductor devices according to claim 15, wherein said impurities introduced into the surface of the material over which the anti-oxidation film has been removed are impurities to impart to the semiconductor material a conductivity type the same as that of the semiconductor material.

29. A method of manufacturing integrated circuit devices, comprising:
selectively forming an anti-oxidation film on portions of the surface of a semiconductor material, leaving other portions of the surface of the semiconductor material exposed;
introducing impurities for forming at least one continuous semiconductor region into the exposed portions, the at least one continuous semiconductor region extending to a major surface of the semiconductor material;
selectively forming an oxide film on said at least one semiconductor continuous region formed in the semiconductor material; and
introducing impurities into the semiconductor material using said oxide film as a mask to thereby introduce said impurities into the semiconductor material, whereby the impurities are introduced in a self-aligned manner with respect to the oxide film.

30. A method of manufacturing integrated circuit devices according to claim 29, wherein the impurities for forming said at least one semiconductor region are introduced into substantially the entire exposed portions.

31. A method of manufacturing integrated circuit devices according to claim 30, wherein said oxide film is formed on a plurality of semiconductor regions formed in the semiconductor material, the plurality of semiconductor regions being spaced from each other.

32. A method of manufacturing integrated circuit devices according to claim 29, wherein the impurities introduced using said oxide film as a mask impart a conductivity to the substrate opposite the conductivity imparted to the substrate by the impurities for forming the at least one continuous semiconductor region.

33. A method of manufacturing integrated circuit devices according to claim 29, wherein said at least one continuous semiconductor region is at least one semiconductor region in which a semiconductor element can be formed.

34. A method of manufacturing semiconductor devices formed at a major surface of a semiconductor substrate comprising:
 (a) locally forming an anti-oxidation film on the surface of the semiconductor substrate;
 (b) introducing impurities of a first type of conductivity into the surface of the semiconductor substrate in portions which are not covered by the anti-oxidation film in order to form at least one semiconductor region of the first type of conductivity;
 (c) selectively oxidizing the surface of the semiconductor substrate, using the anti-oxidation film as a mask, so as to form an oxide film;
 (d) removing the anti-oxidation film, and introducing impurities of a second type of conductivity into the surface of the semiconductor substrate using the oxide film as a mask, in self-aligned manner thereto; and
 (e) forming insulated gate field effect transistors in the at least one semiconductor region, said forming of the transistors including providing gate electrodes on the semiconductor region, and providing source or drain regions of the second type of conductivity in the at least one semiconductor region at the side of the gate electrodes.

35. A method of manufacturing semiconductor devices according to claim 34, wherein the anti-oxidation film includes a silicon nitride film.

36. A method of manufacturing semiconductor devices according to claim 34, wherein the introducing of impurities of the first and second conductivity type leave remaining portions of the surface region of the semiconductor substrate, and wherein the impurities of the first type of conductivity introduced into the surface of the semiconductor substrate are introduced so as to form the at least one semiconductor region, of the first conductivity type, having a lower resistivity than that of remaining portions of the surface region of the semiconductor substrate.

37. A method of manufacturing semiconductor devices according to claim 36, wherein the impurities of the second type of conductivity introduced into the surface of the semiconductor substrate are introduced so as to form semiconductor regions, of the second conductivity type, having a lower resistivity than that of remaining portions of the major semiconductor surface region.

38. A method of manufacturing semiconductor devices, comprising:
 oxidizing a main surface of a semiconductor substrate so as to form a first oxide film on the main surface of the semiconductor substrate;
 locally forming an anti-oxidation film on a surface of said first oxide film;
 introducing impurities which impart a first type of conductivity into the surface of said semiconductor substrate in the portions which are not covered by said anti-oxidation film in order to form at least one semiconductor region;
 oxidizing the surface of said semiconductor substrate, using said anti-oxidation film as a mask so as to form a second oxide film, the second oxide film being formed to have a thickness greater than that of the first oxide film;
 removing said anti-oxidation film, and introducing impurities which impart a second type of conductivity into the surface of said semiconductor substrate at least one portion thereof not including said at least one semiconductor region, the impurities which impart a second conductivity type being introduced using said second oxide film as a mask, whereby the impurities which impart a second conductivity type are introduced relative to the at least one semiconductor region in a self-aligned manner; and
 forming insulated gate field effect transistors in said at least one semiconductor region, the forming of the transistors including providing gate electrodes on said at least one semiconductor region, and providing source and drain regions in said at least one semiconductor region at the sides of said gate electrode.

39. A method of manufacturing semiconductor devices according to claim 38, wherein said first and second oxide films are silicon oxide films, respectively.

40. A method of manufacturing semiconductor devices according to claim 38, wherein said impurities are introduced by ion implantation, and wherein said second oxide film is sufficiently thick so as to prevent introduction of said impurities into the substrate through said second oxide film.

41. A method of manufacturing semiconductor devices according to claim 38, wherein the impurities introduced into the surface of said semiconductor substrate in the part of the semiconductor substrate which is not covered by said anti-oxidation film, and the impurities introduced into the surface of said semiconductor substrate over which the anti-oxidation film has been removed, are impurities which impart opposite conductivity types to the semiconductor substrate.

42. A method of manufacturing semiconductor devices according to claim 41, wherein said semiconductor substrate is of one conductivity type, said one conductivity type being the same as that of said at least one semiconductor region or a semiconductor region formed from introducing impurities into the surface of the semiconductor substrate over which the anti-oxidation film has been removed, and wherein the impurity concentration of the region of the same conductivity type as that of the semiconductor substrate is greater than that of the semiconductor substrate.

43. A method of manufacturing semiconductor devices according to claim 38, wherein said anti-oxidation film is comprised of silicon nitride.

44. A method of manufacturing semiconductor devices according to claim 38, which further comprises:
 locally forming a further anti-oxidation film on the surface of the semiconductor substrate after said introducing impurities into the surface of said semiconductor substrate over which said anti-oxidation film has been removed;

locally oxidizing the surface of said semiconductor substrate where the transistors are not to be formed, using said further anti-oxidation film as a mask, so as to form a field oxide film; and forming a gate oxide film, for an insulated gate field effect transistor, on said at least one semiconductor region.

45. A method of manufacturing semiconductor devices, comprising:

locally forming an anti-oxidation film on a main surface of a semiconductor substrate;

introducing impurities which impart a first type of conductivity into the main surface of said semiconductor substrate, into portions which are not covered by said anti-oxidation film, in order to form at least one semiconductor region;

oxidizing the surface of said semiconductor substrate, using said anti-oxidation film as a mask, so as to form an oxide film;

removing said anti-oxidation film, and introducing impurities which impart a second type of conductivity, that is opposite the first type of conductivity, into the main surface of said semiconductor substrate at at least one portion thereof not including said at least one semiconductor region using said oxide film as a mask, whereby the impurities are introduced relative to the at least one semiconductor region in a self-aligned manner;

locally forming a further anti-oxidation film on the main surface of said semiconductor substrate; and locally oxidizing the surface of said semiconductor substrate, using said further anti-oxidation film as a mask, so as to form a field oxide film.

46. A method of manufacturing semiconductor devices according to claim 45, wherein said oxide film and said field oxide film are comprised of silicon oxide.

47. A method of manufacturing semiconductor devices according to claim 45, wherein said semiconductor substrate is of one conductivity type, said one conductivity type being the same as that of said at least one semiconductor region or a semiconductor region formed from introducing impurities into the surface of the semiconductor substrate over which the anti-oxidation film has been removed, and wherein the impurity concentration of the region of the same conductivity type as that of the semiconductor substrate is greater than that of the semiconductor substrate.

48. A method of manufacturing semiconductor devices according to claim 45, wherein said anti-oxidation and further anti-oxidation films are comprised of silicon nitride.

49. A method of manufacturing semiconductor devices according to claim 45, comprising the further step of forming insulated gate field effect transistors in parts of the semiconductor substrate not having field oxide film thereover, the forming of the transistors including providing gate electrodes on said parts of the semiconductor substrate, and providing source or drain regions in said parts of the semiconductor substrate at the sides of said gate electrodes.

50. A method of manufacturing semiconductor devices according to claim 49, wherein the parts of the semiconductor substrate in which the transistors are formed are the at least one semiconductor region, and wherein the method further comprises:

forming a gate oxide film for each of the insulated gate field effect transistors on said at least one semiconductor region;

forming a gate electrode on said gate oxide film for each of the insulated gate field effect transistors; and introducing impurities which impart the second type of conductivity into the surface of said at least one semiconductor region, using said field oxide film and gate electrodes as masks, so as to provide source and drain regions for said insulated gate field effect transistors.

51. A method of manufacturing semiconductor devices according to claim 45, wherein said field oxide film is formed so as to isolate the insulated gate field effect transistors.

52. A method of manufacturing semiconductor devices, comprising:

oxidizing a main surface of a semiconductor substrate so as to form a first oxide film on the main surface of the semiconductor substrate;

locally forming an anti-oxidation film on a surface of said first oxide film;

introducing impurities which impart a first type of conductivity into the surface of said semiconductor substrate, in portions thereof which are not covered by said anti-oxidation film, in order to form at least one semiconductor region;

oxidizing the main surface of said semiconductor substrate, using said anti-oxidation film as a mask, so as to form a second oxide film, the second oxide film being formed to have a thickness greater than that of said first oxide film;

removing said anti-oxidation film, and introducing impurities which impart a second type of conductivity into the surface of said semiconductor substrate at at least one portion thereof not including said at least one semiconductor region using said second oxide film as a mask, whereby the impurities which impart the second type of conductivity are introduced relative to the at least one semiconductor region in a self-aligned manner;

removing said first and second oxide films, and locally forming a further anti-oxidation film on the surface of said semiconductor substrate; and locally oxidizing the surface of said semiconductor substrate, using said further anti-oxidation film as a mask, so as to form a field oxide film.

53. A method of manufacturing semiconductor devices according to claim 52, wherein said first and second oxide films are comprised of silicon oxide.

54. A method of manufacturing semiconductor devices according to claim 52, wherein said semiconductor substrate is of one conductivity type, said one conductivity type being the same as that of said at least one semiconductor region or a semiconductor region formed from introducing impurities into the surface of the semiconductor substrate over which the anti-oxidation film has been removed, and wherein the impurity concentration of the region of the same conductivity type as that of the semiconductor substrate is greater than that of the semiconductor substrate.

55. A method of manufacturing semiconductor devices according to claim 52, wherein said anti-oxidation and further anti-oxidation films are comprised of silicon nitride.

56. A method of manufacturing semiconductor devices according to claim 52, comprising the further step of forming insulated gate field effect transistors in parts of the semiconductor substrate not having field oxide film thereover, the forming of the transistors including providing gate electrodes on said parts of the semiconductor substrate, and providing source or drain regions in said parts of the semiconductor substrate at the sides of said gate electrodes.

57. A method of manufacturing semiconductor devices according to claim 56, wherein said field oxide film is formed so as to isolate the insulated gate field effect transistors.

58. A method of manufacturing semiconductor devices according to claim 56, wherein the part of the semiconductor substrate in which the transistors are formed are the at least one semiconductor region, and wherein the method further comprises:

forming a gate oxide film for each of the insulated gate field effect transistors on said at least one semiconductor region;

forming a gate electrode on said gate oxide film for each of the insulated gate field effect transistors; and introducing impurities which impart the second type of conductivity into the surface of said at least one semiconductor region, using said field oxide film and gate electrode as masks, so as to provide source and drain regions for said insulated gate field effect transistors.

59. A method of manufacturing semiconductor devices, comprising:

locally forming an anti-oxidation film on a main surface of a semiconductor substrate;

introducing impurities which impart a first type of conductivity into the surface of said semiconductor substrate in the portions which are not covered by said anti-oxidation film, in order to form at least one first semiconductor region;

oxidizing the surface of said semiconductor substrate, using said anti-oxidation film as a mask, so as to form an oxide film;

removing said anti-oxidation film, and introducing impurities which impart a second type of conductivity into the surface of said semiconductor substrate at at least one portion thereof not including said at least one first semiconductor region in order to form at least one second semiconductor region using said oxide film as a mask, whereby the at least one second semiconductor region is formed relative to said first semiconductor region in a self-aligned manner;

introducing impurities which impart the second type of conductivity into said at least one first semiconductor region, so as to form third semiconductor regions providing source and drain regions of insulated gate field effect transistors; and introducing impurities which impart the first type of conductivity into said at least one semiconductor region.

60. A method of manufacturing semiconductor devices according to claim 59, wherein said oxide film is a silicon oxide film.

61. A method of manufacturing semiconductor devices according to claim 59, further comprising, after the introducing impurities for the second semiconductor region:

forming a further anti-oxidation film on the surface of said semiconductor region; and locally oxidizing the surface of said semiconductor substrate where said insulated gate field effect transistors are not to be formed, using said further anti-oxidation film as a mask, so as to locally form a field oxide film.

62. A method of manufacturing semiconductor devices according to claim 61, wherein said field oxide film is formed so as to isolate the insulated gate field effect transistors.

63. A method of manufacturing semiconductor devices according to claim 61, further comprising, after the locally oxidizing the surface of said semiconductor substrate:

forming a gate oxide film for each of the insulated gate field effect transistors on at least said at least one first semiconductor region; and forming a gate electrode on said gate oxide film for each of the insulated gate field effect transistors.

64. A method of manufacturing semiconductor devices according to claim 63, wherein said impurities for said third semiconductor regions are introduced into said at least one first semiconductor region by using said field oxide film and gate electrode as masks.

* * * * *